(12) United States Patent
Fukuchi

(10) Patent No.: US 10,777,475 B2
(45) Date of Patent: Sep. 15, 2020

(54) SEMICONDUCTOR CHIP, SEMICONDUCTOR DEVICE, AND ELECTRONIC DEVICE

(71) Applicant: Renesas Electronics Corporation, Koutou-ku, Tokyo (JP)

(72) Inventor: Kazuhiro Fukuchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 208 days.

(21) Appl. No.: 15/775,825

(22) PCT Filed: Dec. 4, 2015

(86) PCT No.: PCT/JP2015/084147
§ 371 (c)(1),
(2) Date: May 12, 2018

(87) PCT Pub. No.: WO2017/094185
PCT Pub. Date: Jun. 8, 2017

(65) Prior Publication Data
US 2018/0331005 A1    Nov. 15, 2018

(51) Int. Cl.
*H01L 23/28* (2006.01)
*H01L 23/48* (2006.01)
(Continued)

(52) U.S. Cl.
CPC ...... *H01L 23/28* (2013.01); *H01L 21/823487* (2013.01); *H01L 23/3142* (2013.01); *H01L 23/48* (2013.01); *H01L 23/482* (2013.01); *H01L 23/49503* (2013.01); *H01L 23/49562* (2013.01); *H01L 23/5389* (2013.01); *H01L 24/02* (2013.01); *H01L 24/03* (2013.01); *H01L 24/05* (2013.01); *H01L 24/06* (2013.01); *H01L 24/19* (2013.01); *H01L 24/32* (2013.01); *H01L 24/96* (2013.01); *H01L 25/07* (2013.01); *H01L 25/18* (2013.01); *H01L 27/088* (2013.01);
(Continued)

(58) Field of Classification Search
CPC ............................. H01L 23/28; H01L 23/48
USPC .......................................................... 257/161
See application file for complete search history.

(56) References Cited

U.S. PATENT DOCUMENTS 5,682,050 A    10/1997  Williams
6,218,889 B1 *  4/2001  Fujiki ................. H01L 23/34
                                                257/E23.8
(Continued)

FOREIGN PATENT DOCUMENTS

JP    S63-213362 A    9/1988
JP    H07-106497 A    4/1995
(Continued)

OTHER PUBLICATIONS

International Search Report from International Patent Application No. PCT/JP2015/084147, dated Feb. 16, 2016.
(Continued)

*Primary Examiner* — Igwe U Anya
(74) *Attorney, Agent, or Firm* — SGPatents PLLC

(57) ABSTRACT

In order to improve reliability of a semiconductor device, in a semiconductor chip according to one embodiment, an uneven shape is formed on an exposed surface of a back surface electrode formed on a back surface of the semiconductor chip.

20 Claims, 23 Drawing Sheets

(51) Int. Cl.

| | | |
|---|---|---|
| *H01L 23/00* | (2006.01) | |
| *H01L 23/482* | (2006.01) | |
| *H01L 23/495* | (2006.01) | |
| *H01L 23/31* | (2006.01) | |
| *H01L 23/538* | (2006.01) | |
| *H01L 23/498* | (2006.01) | |
| *H01M 10/44* | (2006.01) | |
| *H01L 29/78* | (2006.01) | |
| *H02J 7/00* | (2006.01) | |
| *H01L 27/088* | (2006.01) | |
| *H03K 17/687* | (2006.01) | |
| *H01L 21/8234* | (2006.01) | |
| *H01L 25/07* | (2006.01) | |
| *H01L 25/18* | (2006.01) | |

(52) U.S. Cl.
CPC ........ *H01L 29/7813* (2013.01); *H01M 10/44* (2013.01); *H02J 7/0031* (2013.01); *H02J 7/0072* (2013.01); *H03K 17/6874* (2013.01); *H01L 23/49827* (2013.01); *H01L 24/48* (2013.01); *H01L 24/73* (2013.01); *H01L 2224/0345* (2013.01); *H01L 2224/0346* (2013.01); *H01L 2224/03831* (2013.01); *H01L 2224/04026* (2013.01); *H01L 2224/04042* (2013.01); *H01L 2224/04105* (2013.01); *H01L 2224/05551* (2013.01); *H01L 2224/05557* (2013.01); *H01L 2224/0603* (2013.01); *H01L 2224/06181* (2013.01); *H01L 2224/24137* (2013.01); *H01L 2224/24195* (2013.01); *H01L 2224/2518* (2013.01); *H01L 2224/32014* (2013.01); *H01L 2224/32245* (2013.01); *H01L 2224/48095* (2013.01); *H01L 2224/48247* (2013.01); *H01L 2224/73265* (2013.01); *H01L 2224/92144* (2013.01); *H01L 2224/94* (2013.01); *H01L 2924/00014* (2013.01); *H01L 2924/13055* (2013.01); *H01L 2924/13091* (2013.01); *H01L 2924/181* (2013.01); *H01L 2924/19105* (2013.01); *H01L 2924/3511* (2013.01)

(56) References Cited

U.S. PATENT DOCUMENTS

| | | | |
|---|---|---|---|
| 2003/0052405 A1 | 3/2003 | Moriguchi | |
| 2005/0017339 A1 | 1/2005 | Yoshiba et al. | |
| 2006/0055432 A1* | 3/2006 | Shimokawa | H01L 21/565 327/5 |
| 2006/0263988 A1* | 11/2006 | Takahashi | H01L 24/06 438/286 |
| 2007/0197017 A1* | 8/2007 | Fujimoto | H01L 24/48 438/617 |
| 2007/0215903 A1* | 9/2007 | Sakamoto | H01L 23/49844 257/192 |
| 2012/0292773 A1 | 11/2012 | Hosseini et al. | |
| 2013/0092948 A1* | 4/2013 | Otsuka | H01L 25/0655 257/76 |
| 2013/0221514 A1* | 8/2013 | Otsuka | H01L 23/3735 257/712 |
| 2014/0353822 A1 | 12/2014 | Oyachi et al. | |
| 2015/0008534 A1 | 1/2015 | Nagase et al. | |

FOREIGN PATENT DOCUMENTS

| | | |
|---|---|---|
| JP | H08-037302 A | 2/1996 |
| JP | 2003-086737 A | 3/2003 |
| JP | 2003-163240 A | 6/2003 |
| JP | 2006-019341 A | 1/2006 |
| JP | 2015-015350 A | 1/2015 |

OTHER PUBLICATIONS

Extended European Search Report and Search Opinion dated May 9, 2019, in European Patent Application No. 15909815.1.
Japanese Office Action dated May 14, 2019, in Japanese Patent Application No. 2017-553588.

\* cited by examiner

FIG. 23
(a)
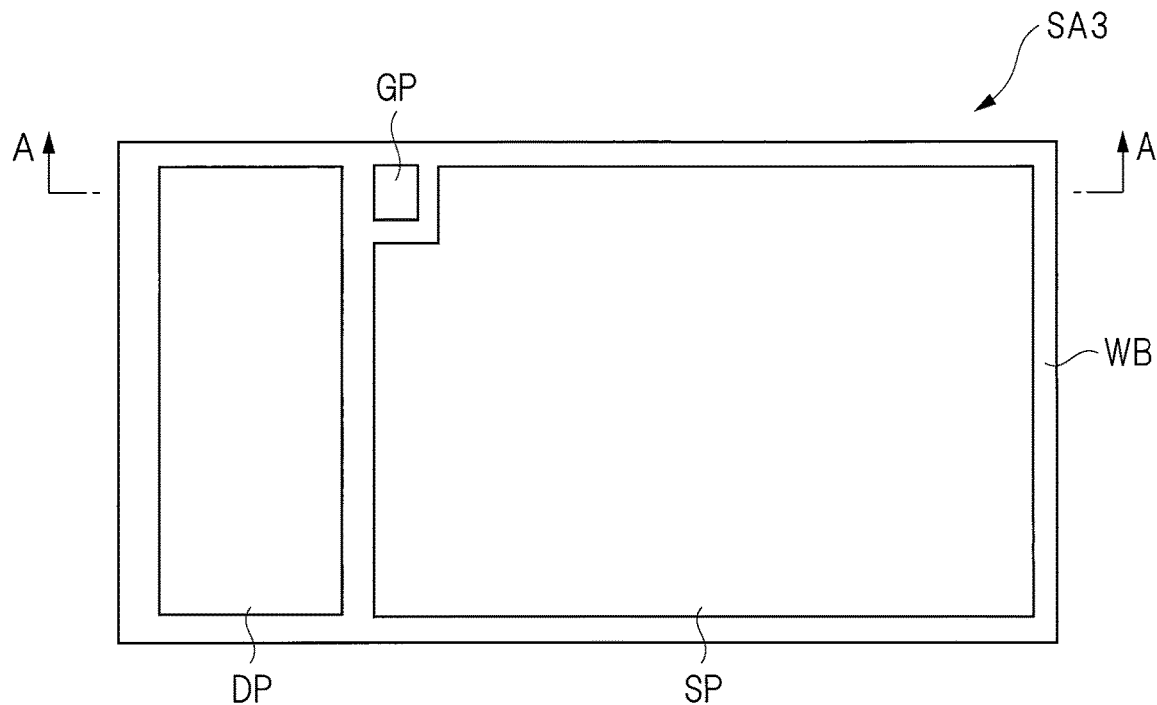
(b)
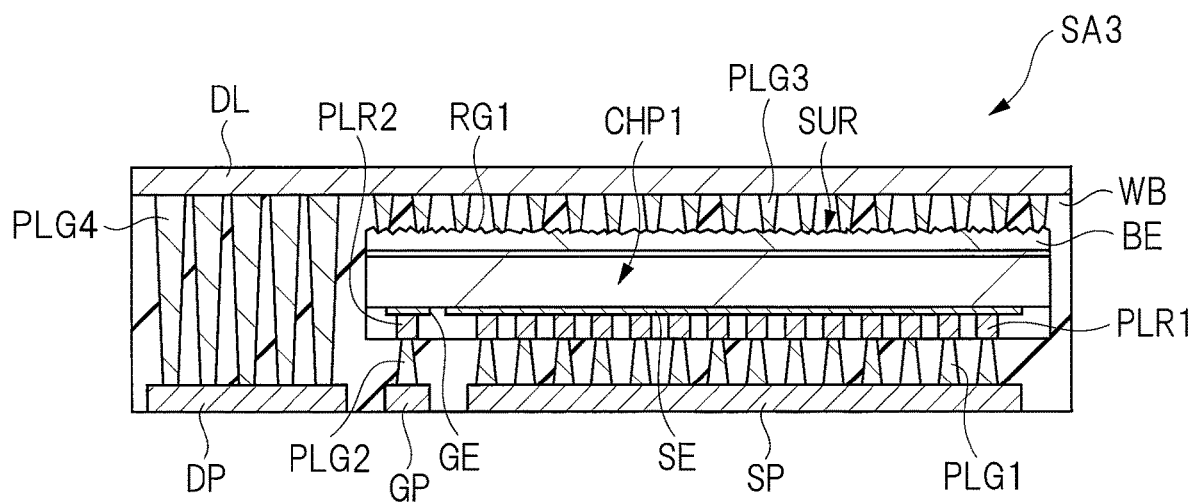

SEMICONDUCTOR CHIP, SEMICONDUCTOR DEVICE, AND ELECTRONIC DEVICE

TECHNICAL FIELD

The present invention relates to a semiconductor chip and a semiconductor device, and an electronic device and relates to, for example, a technique effectively applied to a semiconductor device including a structural body in which a semiconductor chip in which a power transistor is formed is covered with a sealing member.

BACKGROUND ART

In Japanese Patent Application Laid-Open Publication No. 2006-19341 (Patent Document 1), a technique is described in which a semiconductor chip is embedded in a multilayer substrate including a resin layer and surface roughness of a back surface of the semiconductor chip is roughened.

In Japanese Patent Application Laid-Open Publication No. 2003-163240 (Patent Document 2), a technique of embedding a semiconductor chip among a plurality of substrates is described.

RELATED ART DOCUMENTS

Patent Documents

Patent Document 1: Japanese Patent Application Laid-Open Publication No. 2006-19341
Patent Document 2: Japanese Patent Application Laid-Open Publication No. 2003-163240

SUMMARY OF THE INVENTION

Problems to be Solved by the Invention

For example, a semiconductor device is made up of a structural body in which a semiconductor component is sealed with a sealing member. In particular, there is a semiconductor chip as a semiconductor component in which an integrated circuit is formed, but this semiconductor chip is often made mainly of silicon. Therefore, from the viewpoint of improving reliability of the semiconductor device, in order to improve adhesion between the semiconductor chip and the sealing member, a study is often made to improve adhesion between silicon and a material of the sealing member.

However, particularly when a semiconductor chip in which a power transistor is formed is focused, the inventor of the present application found that new matters to be studied exist in order to improve the adhesion between the semiconductor chip and the sealing member. That is, in recent years, in order to improve a degree of integration of unit transistors while achieving miniaturization, a vertical structure that passes current in a thickness direction of the semiconductor chip is often adopted as a structure of the power transistor. In this case, electrodes (hereinafter referred to as back surface electrodes) are formed on a surface (back surface) on a drain side or a collector side of the semiconductor chip. Therefore, when a semiconductor chip in which a power transistor is formed is sealed with a sealing member, it is necessary to consider adhesion between the back surface electrode and the sealing member as well. In particular, according to new finding found by the inventor of the present application, the adhesion between the back surface electrode and the sealing member is worse than the adhesion between the silicon and the material of the sealing member, and therefore, in order to improve the reliability of the semiconductor device, it is required to devise measures of improving the adhesion between the back surface electrode and the sealing member. In other words, when a semiconductor device is made up of a structural body in which a semiconductor chip having a power transistor formed therein is sealed with a sealing member, in order to improve the reliability of the semiconductor device, it is desired to devise measures of improving the adhesion between the back surface electrode and the sealing member.

Other objects and novel features of the present invention will be apparent from the description of the present specification and the accompanying drawings.

Means for Solving the Problems

In a semiconductor chip according to one embodiment, an uneven shape is formed on a front surface of a back surface electrode formed on a back surface of the semiconductor chip.

Effects of the Invention

According to one embodiment, reliability of a semiconductor device can be improved.

BRIEF DESCRIPTIONS OF THE DRAWINGS

FIG. 23(a) is a plan view seen from a lower surface of a semiconductor device according to a third embodiment; and FIG. 23(b) is a cross-sectional view taken along a line A-A of FIG. 23(a).

DETAILED DESCRIPTION OF PREFERRED EMBODIMENTS

Figure 1:
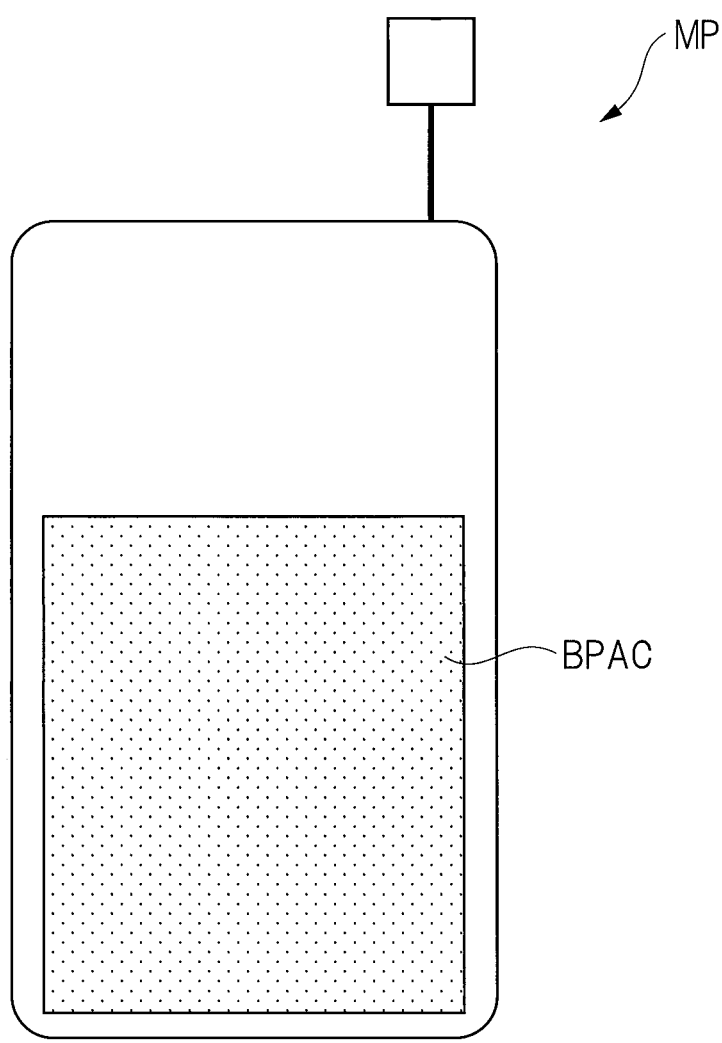
FIG. 1 is a plan view of a mobile phone viewed from a rear side.

In embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle.

The number larger or smaller than the specific number is also applicable.

Further, in the embodiments described below, it goes without saying that the components (including element steps and the like) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Note that components having the same function are denoted by the same reference characters throughout the drawings for describing the embodiments, and the repetitive description thereof is omitted in principle. Note that hatching may be used even in a plan view so as to make the drawings easy to see.

First Embodiment

Explanation of Terms

In the present specification, an "electronic component" means a component making use of electrons. In particular, a component making use of electrons in a semiconductor is a "semiconductor component." An example of this "semiconductor component" is a semiconductor chip. Therefore, the term including the "semiconductor chip" is the "semiconductor component." The broader concept of the "semiconductor component" is the "electronic component."

Also, In the present specification, the "semiconductor device" is a structural body including a semiconductor component and an external connection terminal electrically connected to the semiconductor component and means a structural body (including a structural body embedded in a wiring substrate) in which the semiconductor component is covered with a sealing body. In particular, the "semiconductor device" is configured to be electrically connectable with an external device by the external connection terminal.

Furthermore, in the present specification, a "power transistor" means an aggregate of unit transistors realizing a function of a unit transistor even at a current larger than an allowable current of the unit transistor by connecting a plurality of unit transistors (cell transistors) in parallel (for example, connecting several thousands to hundreds of thousands of unit transistors in parallel). For example, when the unit transistor functions as a switching element, the "power transistor" becomes a switching element applicable also to a current larger than the allowable current of the unit transistor. In particular, in the present specification, the term "power transistor" is used as a term indicating a broader concept including, for example, both a "power MOSFET" and an "IGBT."

<Appearance Configuration of Mobile Phone>

FIG. 1 is a plan view of a mobile phone (smartphone) MP viewed from a rear side. As shown in FIG. 1, the mobile phone MP according to this first embodiment has a substantially rectangular shape. On aback surface of the mobile phone MP, a battery pack BPAC including a power supply for operating the mobile phone MP is built in. The battery pack BPAC has, for example, a chargeable and dischargeable secondary battery. The secondary battery functions as a power source for operating the mobile phone MP. Also, the battery pack BPAC can be removed from the mobile phone MP. When performance of the battery pack BPAC deteriorates, the battery pack BPAC can easily be replaced with a new battery pack BPAC.

<Schematic Configuration of Battery Pack>

Figure 2:
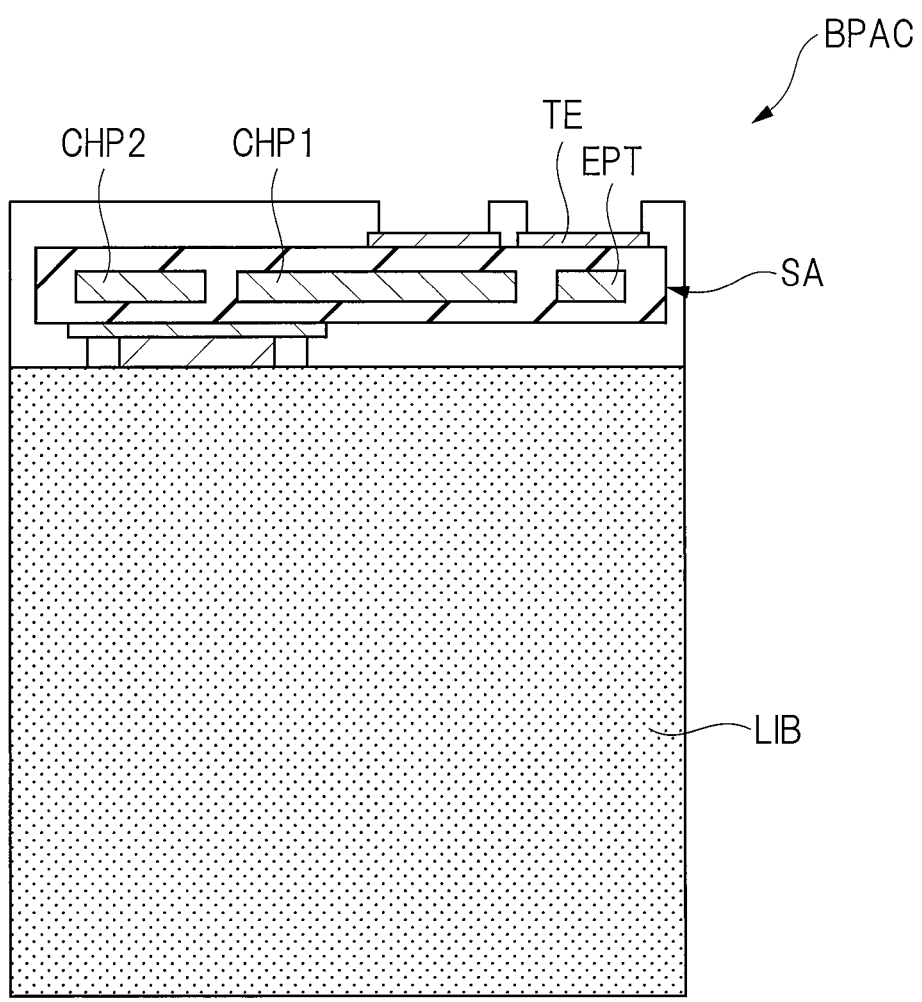
FIG. 2 is a schematic diagram showing a schematic configuration of a battery pack.

FIG. 2 is a schematic diagram showing a schematic configuration of the battery pack BPAC. As shown in FIG. 2, for example, the battery pack BPAC includes a lithium ion battery LIB which is an example of a chargeable and dischargeable secondary battery, and a semiconductor device SA which controls charging and discharging of the lithium ion battery LIB. The battery pack BPAC is configured as an electronic device in which the lithium ion battery LIB and the semiconductor device SA are electrically connected. As shown in FIG. 2, the semiconductor device SA includes a semiconductor chip CHP1 in which a power transistor is formed, a semiconductor chip CHP2 in which an integrated circuit is formed, and an electronic component such as a capacitor (capacitive element) and a resistive element. In this case, as shown in FIG. 2, a size of the semiconductor chip CHP1 is larger than a size of the semiconductor chip CHP2. The semiconductor chip (control chip) CHP2 functions as a control unit controlling charging and discharging of the lithium ion battery LIB. The semiconductor chip CHP1 is electrically connected to this control unit and functions as a bidirectional connection unit through which charge and discharge currents flow. Then, in the semiconductor device SA, an external connection terminal TE connectable to the outside is formed. By connecting the external connection terminal TE formed in this semiconductor device SA to the mobile phone main body, it is possible to supply power from the battery pack BPAC to the mobile phone main body. The schematic configuration of the battery pack BPAC is formed as described above.

<Usefulness of Bidirectional Connection Unit>

As described above, the battery pack BPAC includes a semiconductor chip CHP1 functioning as the bidirectional connection unit. In the following description, usefulness of the bidirectional connection unit formed in this semiconductor chip CHP1 will be described. The bidirectional connection unit is used for a purpose of flowing current in two directions. For example, the bidirectional connection unit is made up of the semiconductor chip CHP1 in which a power transistor is formed as a semiconductor component flowing charge and discharge currents of the secondary battery.

Figure 3:
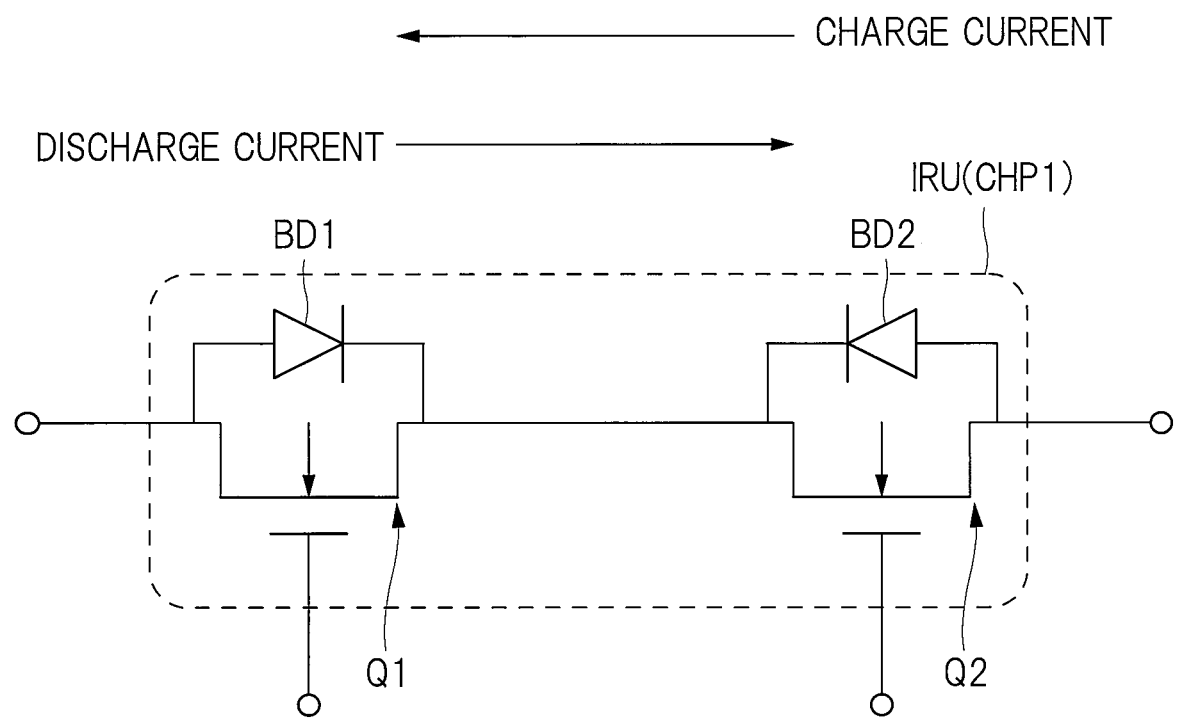
FIG. 3 is a circuit diagram showing a simple circuit configuration of a bidirectional connection unit formed in a semiconductor chip.

FIG. 3 is a circuit diagram showing a simple circuit configuration of a bidirectional connection unit IRU formed in the semiconductor chip CHP1. In FIG. 3, the bidirectional connection unit IRU has a configuration in which a discharge power transistor Q1 including an n-channel field effect transistor and a charge power transistor Q2 including an n-channel field effect transistor are reversely connected in series. That is, in the bidirectional connection unit IRU, the discharge power transistor Q1 and the charge power transistor Q2 are connected such that a drain of the discharge power transistor Q1 and a drain of the charge power transistor Q2 are electrically connected to each other. In other words, the discharge power transistor Q1 and the charge power transistor Q2 are connected such that a cathode of a body diode BD1 parasitically formed in the discharge power transistor Q1 and a cathode of a body diode BD2 parasitically formed in the charge power transistor Q2 are electrically connected. In the bidirectional connection unit IRU configured in this manner, for example, as shown in FIG. 3, a discharge current is allowed to flow from a left side to a right side, and a charge current is allowed to flow from the right side to the left side. That is, a discharge current and a charge current in opposite directions flow in the bidirectional connection unit IRU.

Suppose, for example, there is a case where the bidirectional connection unit IRU includes only the discharge power transistor Q1. Also in this case, it can be considered that the discharge current and the charge current are allowed to flow by setting the discharge power transistor Q1 to an ON state. However, when the bidirectional connection unit IRU includes only the discharge power transistor Q1, even if the discharge power transistor Q1 is set to an OFF state to stop the discharge current, the discharge current flows through the body diode BD1 parasitically formed in the discharge power transistor Q1. Thus, when the bidirectional connection unit IRU includes only the discharge power transistor Q1, a disadvantage that the discharge current cannot be stopped is caused. In contrast, when the bidirectional connection unit IRU includes only the charge power transistor Q2, even if the charge power transistor Q2 is set to an OFF state to stop the charge current, the charge current flows through the body diode BD2 parasitically formed in the charge power transistor Q2. Thus, when the bidirectional connection unit IRU includes only the charge power transistor Q2, a disadvantage that the charge current cannot be stopped is caused.

Therefore, in order to solve the above-mentioned disadvantages, the bidirectional connection unit IRU has both the discharge power transistor Q1 and the charge power transistor Q2 as shown in FIG. 3, and the discharge power transistor Q1 and the charge power transistor Q2 are reversely connected in series. As a result, control to stop a discharge current and a charge current can be performed. The reason will be described below.

In FIG. 3, when the discharge power transistor Q1 is set to the ON state and the charge power transistor Q2 is set to an ON state, a discharge current is allowed to flow. When the discharge current is to be stopped, the discharge power transistor Q1 is set to the OFF state, and the charge power transistor Q2 is set to the OFF state. In this case, even when the discharge power transistor Q1 is set to the OFF state, the discharge current flows through the body diode BD1 parasitically present in the discharge power transistor Q1. However, the bidirectional connection unit IRU shown in FIG. 3 has the charge power transistor Q2 reversely connected in series with the discharge power transistor Q1. The charge power transistor Q2 is in the OFF state, and the body diode BD2 parasitically formed in the charge power transistor Q2 is in a direction opposite to a flowing direction of a discharge current. For this reason, the flow of the discharge current is blocked by the body diode BD2. Accordingly, the bidirectional connection unit IRU shown in FIG. 3 can perform control so as to stop the discharge current.

Likewise, in FIG. 3, when the discharge power transistor Q1 is set to the ON state and the charge power transistor Q2 is set to the ON state, a charge current is allowed to flow. When the charge current is to be stopped, the discharge power transistor Q1 is set to the OFF state and the charge power transistor Q2 is set to the OFF state. In this case, even when the charge power transistor Q2 is set to the OFF state, the charge current flows through the body diode BD2 parasitically present in the charge power transistor Q2. However, the bidirectional connection unit IRU shown in FIG. 3 has the discharge power transistor Q1 reversely connected in series with the charge power transistor Q2. The discharge power transistor Q1 is in the OFF state, and the body diode BD1 parasitically formed in the discharge power transistor Q1 is in a direction opposite to the flowing direction of a charge current. For this reason, the flow of the charge current is blocked by the body diode BD1. For this reason, the bidirectional connection unit IRU shown in FIG. 3 can perform control so as to stop the charge current.

Therefore, as shown in FIG. 3, when the bidirectional connection unit IRU includes the discharge power transistor Q1 and the charge power transistor Q2 which are reversely connected in series, ON/OFF control of each of the discharge current and the charge current can be carried out. That is, the bidirectional connection unit IRU shown in FIG. 3 enables ON/OFF control of each of the discharge current and the charge current. In this respect, the bidirectional connection unit IRU shown in FIG. 3 is useful.

<Circuit Configuration of Battery Pack>

Figure 4:
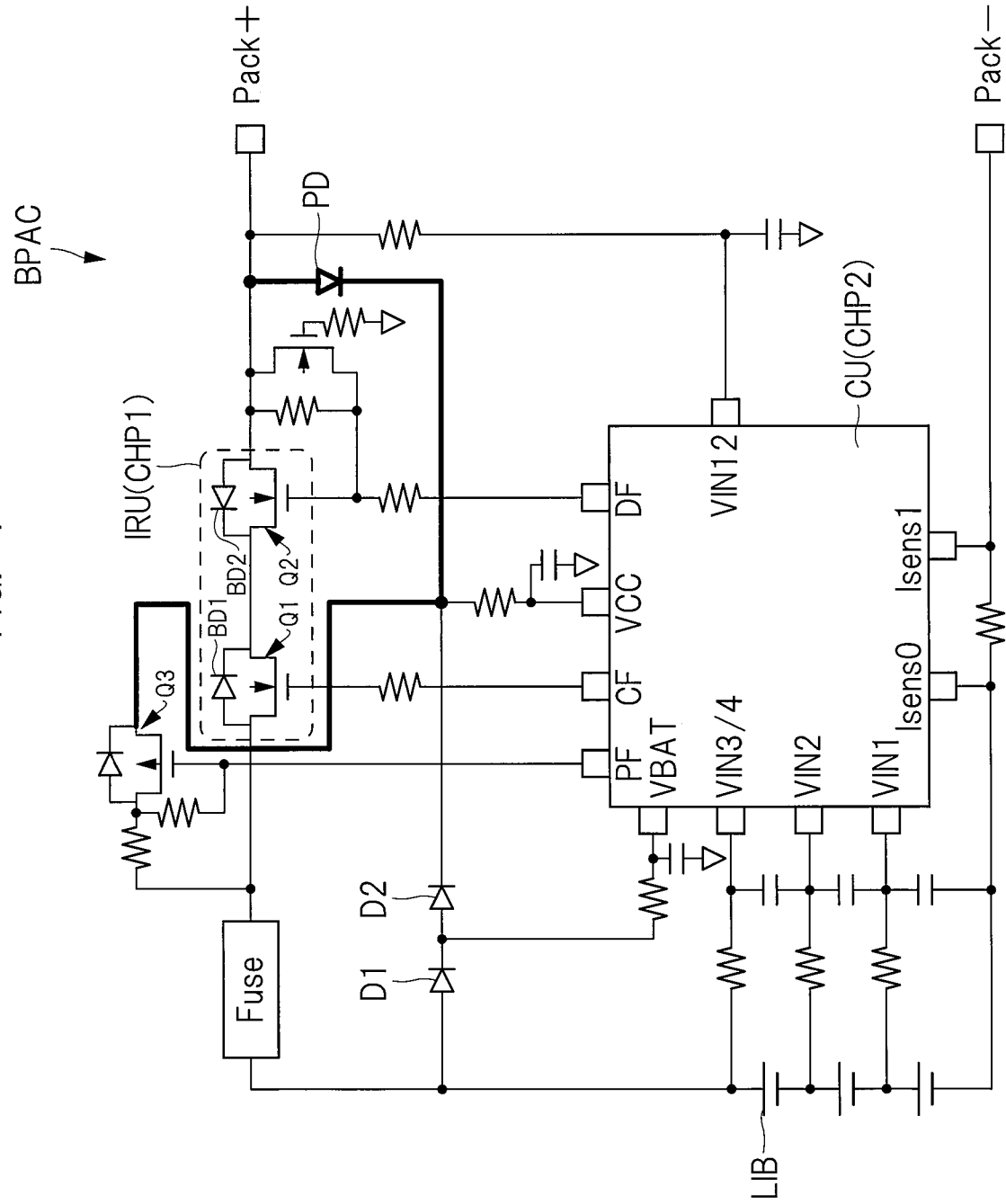
FIG. 4 is a circuit diagram showing a circuit configuration example of the battery pack.

Next, a circuit configuration of the battery pack BPAC having the bidirectional connection unit IRU described above will be described. FIG. 4 is a circuit diagram showing a circuit configuration example of the battery pack BPAC. In FIG. 4, the battery pack BPAC includes the lithium ion battery LIB which is an example of a chargeable and dischargeable secondary battery between a positive terminal Pack+ and a negative terminal Pack– of the battery pack BPAC. This lithium ion battery LIB is electrically connected to a control unit CU which controls the charge and discharge of the lithium ion battery LIB. Specifically, the control unit CU includes, for example, a control IC, and the lithium ion battery LIB and input terminals (terminals VIN1, VIN2, and VIN3/4) of the control unit CU are electrically connected. Also, the terminals (Isens0, Isens1) of the control unit CU are electrically connected to the negative terminal Pack– of the battery pack BPAC.

Next, the lithium ion battery LIB and the bidirectional connection unit IRU are electrically connected via a fuse (Fuse). Furthermore, the bidirectional connection unit IRU is electrically connected to the positive terminal Pack+ of the battery pack BPAC. The bidirectional connection unit IRU includes the discharge power transistor Q1 and the charge power transistor Q2 that are reversely connected in series to each other. In the discharge power transistor Q1, the body diode BD1 is parasitically formed. Likewise, the body diode BD2 is parasitically formed also in the charge power transistor Q2.

Here, the bidirectional connection unit IRU and the control unit CU are electrically connected. More specifically, a gate of the discharge power transistor Q1 and a terminal CF of the control unit CU are electrically connected, and a gate of the charge power transistor Q2 and a terminal DF of the control unit CU are electrically connected to each other. As a result, the control unit CU controls ON/OFF of charge and discharge currents flowing through the bidirectional connection unit IRU.

Subsequently, a power supply terminal VCC of the control unit CU is electrically connected to the lithium ion battery LIB via a diode D1 and a diode D2 connected in series. Also, a connection node between the diode D1 and the diode D2 is electrically connected to a terminal VBAT of the control unit CU.

Furthermore, the positive terminal Pack+ of the battery pack BPAC and a terminal VIN12 of the control unit CU are electrically connected. A protection diode PD is connected between the positive terminal Pack+ of the battery pack BPAC and the power supply terminal VCC of the control unit CU. More specifically, an anode of this protection diode PD is connected to the positive terminal Pack+ of the battery pack BPAC. A cathode of this protection diode PD is connected to the power supply terminal VCC of the control unit CU. A normally-on power transistor Q3 of a p-channel field effect transistor is electrically connected to the power supply terminal VCC of the control unit CU. This normally-on power transistor Q3 is connected to a connection node between the fuse (Fuse) and the bidirectional connection unit IRU. A gate of the normally-on power transistor Q3 is electrically connected to a terminal PF of the control unit CU. In this manner, the circuit configuration of the battery pack BPAC is made.

<Circuit Operation of Battery Pack>

Main circuit operation of the battery pack BPAC will be described below.

First, referring to FIG. 4, a basic operation of charge and discharge will be described. An operation of connecting a load between the positive terminal Pack+ and the negative terminal Pack– of the battery pack BPAC to flow a discharge current from the lithium ion battery LIB will be described. In FIG. 4, a gate voltage equal to or higher than a threshold voltage is applied from the terminal CF of the control unit CU to the gate of the discharge power transistor Q1, and a gate voltage equal to or higher than the threshold voltage is applied to the gate of the charge power transistor Q2 from the terminal DF of the control unit CU. Accordingly, the discharge power transistor Q1 and the charge power transistor Q2 constituting the bidirectional connection unit IRU are in the ON state. As a result, the discharge current flows from the lithium ion battery LIB to the positive terminal Pack+ of the battery pack BPAC via the fuse and the bidirectional connection unit IRU. Conversely, when the discharge current is to be stopped, a gate voltage lower than the threshold voltage is applied from the terminal CF of the control unit CU to the gate of the discharge power transistor Q1, and a gate voltage lower than the threshold voltage is applied from the terminal DF of the control unit CU to the gate of the charge power transistor Q2. Accordingly, the discharge power transistor Q1 and the charge power transistor Q2 constituting the bidirectional connection unit IRU are in the OFF state. As a result, the discharge current from the lithium ion battery LIB is cut off at the bidirectional connection unit IRU.

Next, an operation of connecting a charger between the positive terminal Pack+ and the negative terminal Pack– of the battery pack BPAC and flowing a charge current to the lithium ion battery LIB will be described. In FIG. 4, a gate voltage equal to or higher than a threshold voltage is applied from the terminal CF of the control unit CU to the gate of the discharge power transistor Q1, and agate voltage equal to or higher than the threshold voltage is applied from the terminal DF of the control unit CU to the gate of the charge power transistor Q2. Accordingly, the discharge power transistor Q1 and charge power transistor Q2 constituting the bidirectional connection unit IRU are in the ON state. As a result, a charge current flows from the positive terminal Pack+ of the battery pack BPAC connected to the charger to the lithium ion battery LIB via the bidirectional connection unit IRU and the fuse. Conversely, when the charge current is to be stopped, a gate voltage lower than the threshold voltage is applied from the terminal CF of the control unit CU to the gate of the discharge power transistor Q1, and a gate voltage lower than the threshold voltage is applied from the terminal DF of the control unit CU to the gate of the charge power transistor Q2. As a result, the discharge power transistor Q1 and charge power transistor Q2 constituting the bidirectional connection unit IRU are in the OFF state. As a result, the charge current from the charger is cut off at the bidirectional connection unit IRU.

Figure 5:
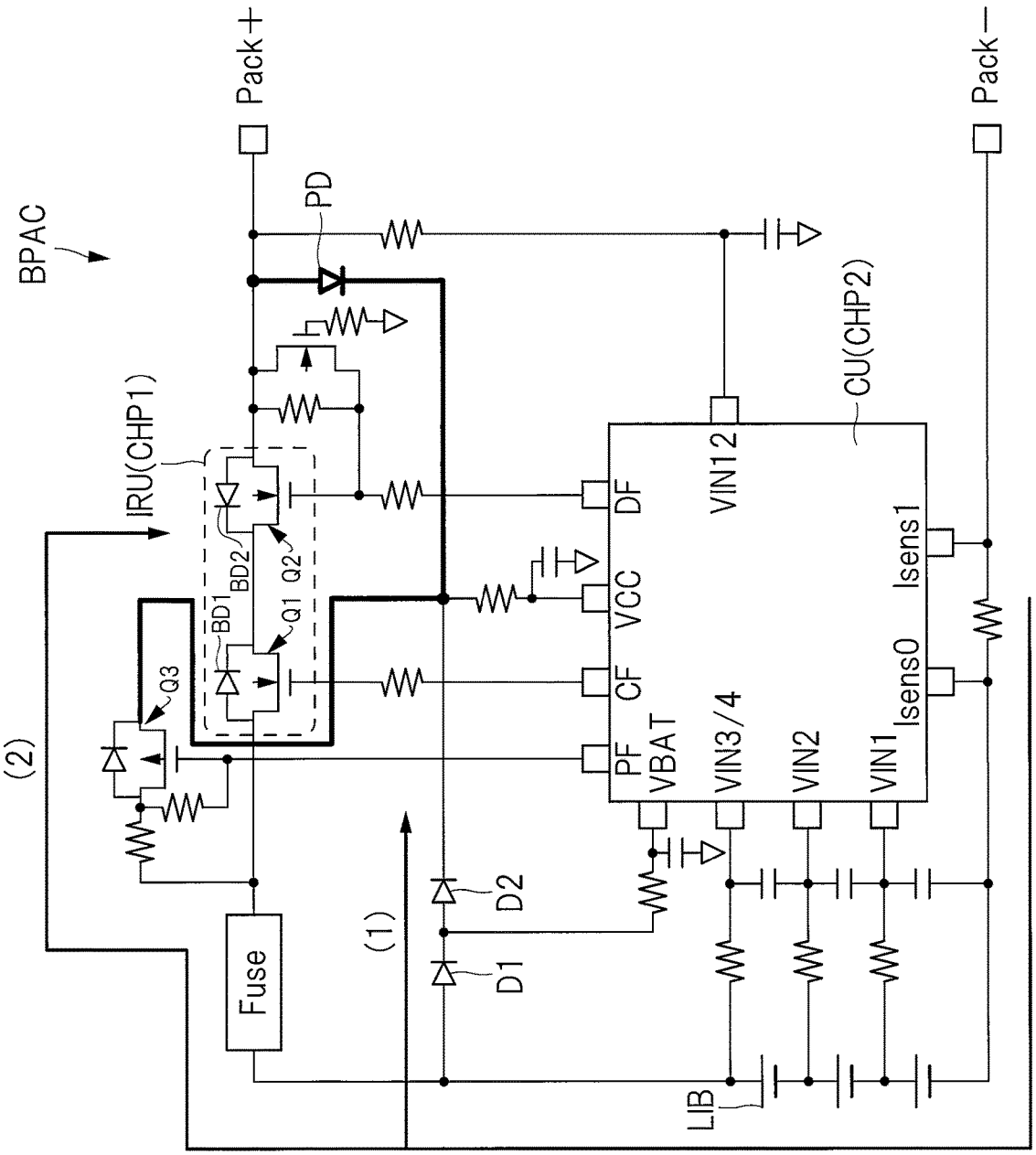
FIG. 5 is a diagram for explaining a power supply path from a lithium ion battery to a control unit during normal operation.

Next, during normal operation of the lithium ion battery LIB, a power supply path from the lithium ion battery LIB to the control unit CU will be described. FIG. 5 is a diagram for explaining the power supply path from the lithium ion battery LIB to the control unit CU during normal operation. In FIG. 5, the path shown below is the power supply path from the lithium ion battery LIB to the control unit CU during normal operation. In other words, it can be understood that there are a path (1) from the lithium ion battery LIB via the diode D1 and the diode D2 to the power supply terminal VCC of the control unit CU and a path (2) from the lithium ion battery LIB via the fuse and the normally-on power transistor Q3 to the power supply terminal VCC of the control unit CU.

Figure 6:
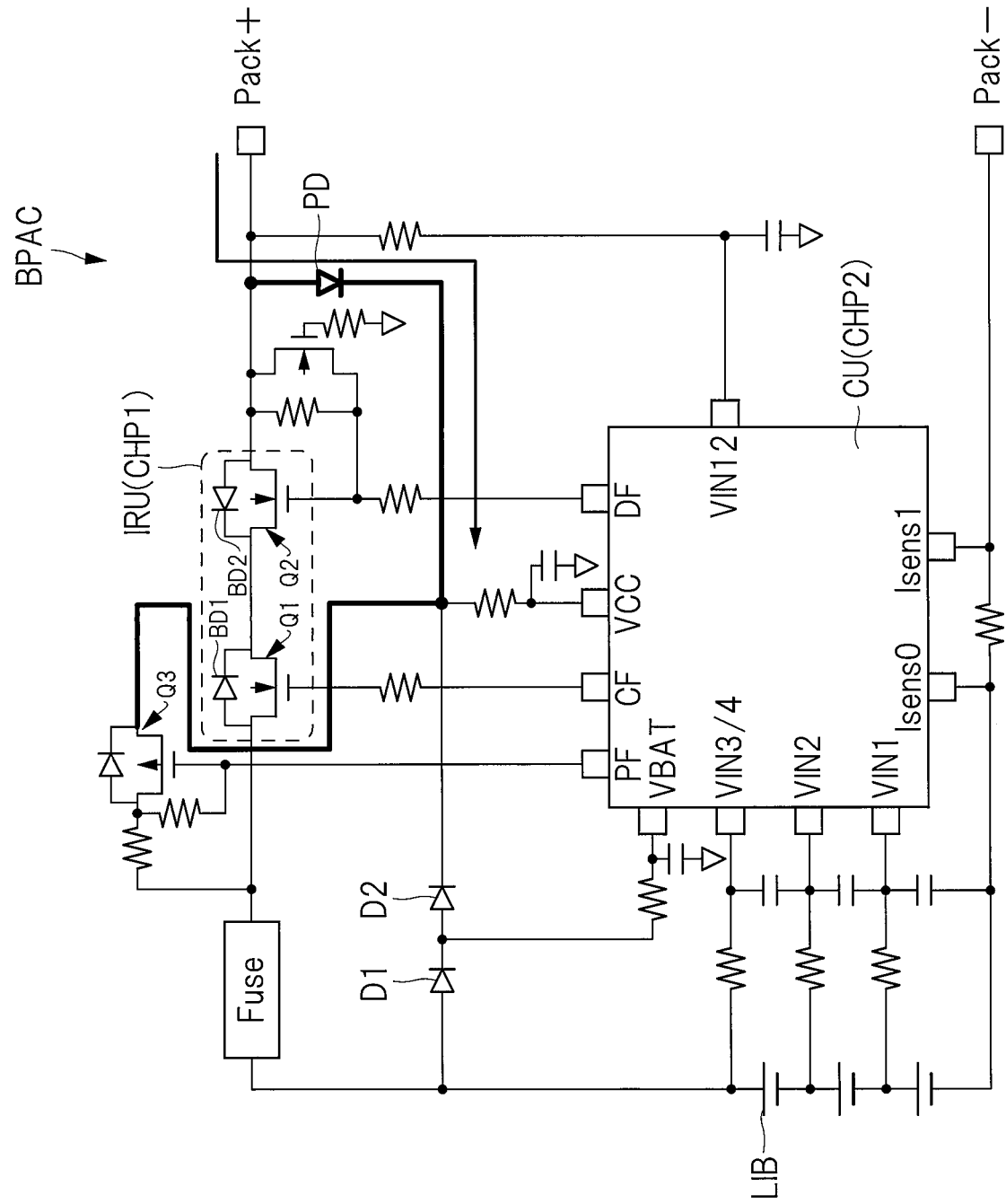
FIG. 6 is a diagram for explaining a power supply path from a charger to the control unit at the time of precharge.

Next, the power supply path from the charger to the control unit CU when the lithium ion battery LIB is empty (at the time of precharge) will be described. FIG. 6 is a diagram for explaining a power supply path from the charger to the control unit CU at the time of precharge. In FIG. 6, there is a path from the positive terminal Pack+ of the battery pack BPAC to the power supply terminal VCC of the control unit CU via the protection diode PD, as the power supply path from the charger to the control unit CU at the time of precharge.

Figure 7:
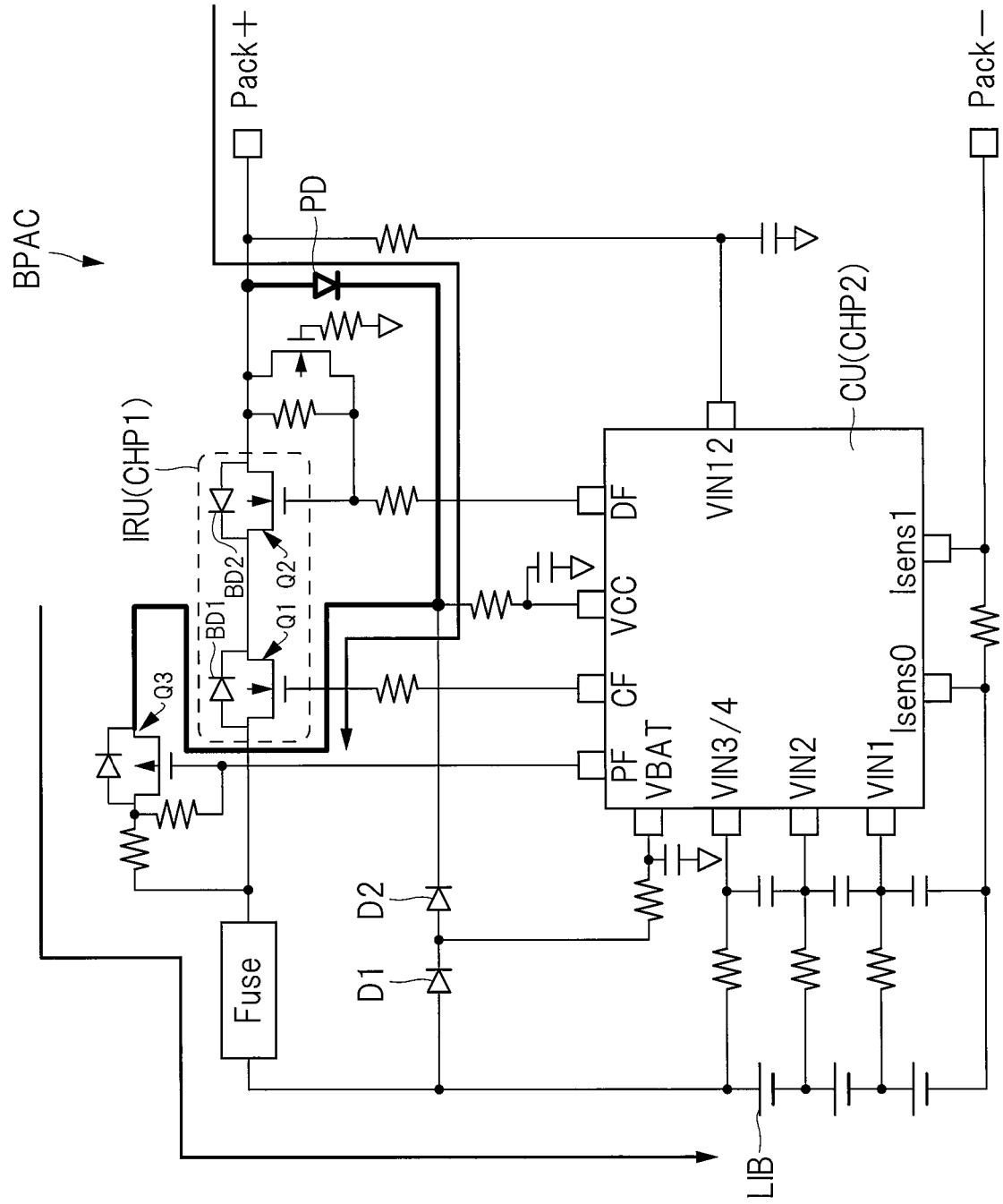
FIG. 7 is a diagram for explaining a current path through which a precharge current from the charger to the lithium ion battery flows at the time of precharge.

Next, a current path of a charge current at the time of precharge will be described. FIG. 7 is a diagram for explaining a current path through which a precharge current from the charger to the lithium ion battery LIB flows at the time of precharge. First, in FIG. 7, as a current path through which the precharge current flows, a path flowing from the positive terminal Pack+ of the battery pack BPAC to the lithium ion battery LIB via the bidirectional connection unit IRU and the fuse is conceivable. However, when the lithium ion battery LIB is empty (at the time of precharge), an operating voltage of the control unit CU cannot be obtained sufficiently, especially in an overdischarge state (a state in which a battery voltage is significantly lowered). As a result, it is impossible to control the bidirectional connection unit IRU by the control unit CU. That is, it is impossible to set the discharge power transistor Q1 and the charge power transistor Q2 to the ON state by applying a gate voltage equal to or higher than the threshold voltage from the terminal CF of the control unit CU to the gate of the discharge power transistor Q1 and applying a gate voltage equal to or higher than the threshold voltage from the terminal DF of the control unit CU to the gate of the charge power transistor Q2.

Therefore, as shown in FIG. 7, as the current path through which the precharge current flows, there is provided a path for flowing the precharge current from the positive terminal Pack+ of the battery pack BPAC to the lithium ion battery LIB via the protection diode PD and the normally-on power transistor Q3. In this path, even if the operating voltage of the control unit CU cannot be obtained sufficiently in the overdischarge state, the normally-on power transistor Q3 operating at a gate voltage of 0 V can secure the current path through which the precharge current flows.

Figure 8:
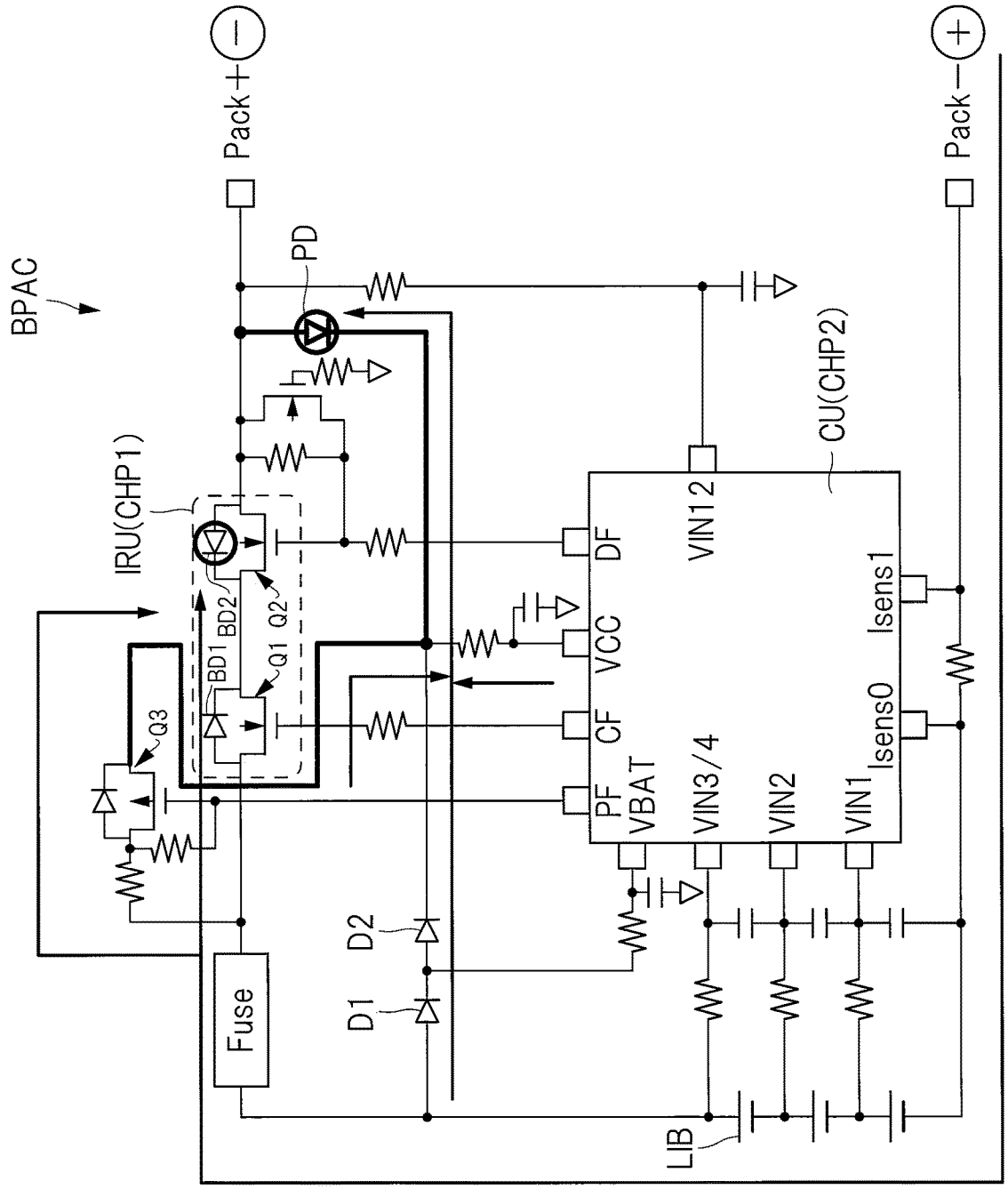
FIG. 8 is a diagram for explaining a path where a reverse charging current is cut off.

Next, a function of cutting off a reverse charging current in a case where the battery pack BPAC is incorrectly reversely charged (abnormal case) will be described. FIG. 8 is a diagram for explaining a path where the reverse charging current is cut off. In FIG. 8, first, during reverse charging, a negative potential is applied to the positive terminal Pack+ of the battery pack BPAC, and a positive potential is applied to the negative terminal Pack− of the battery pack BPAC. In this case, as shown in FIG. 8, the reverse charging current flowing from the lithium ion battery LIB via the fuse to the bidirectional connection unit IRU is cut off by the body diode BD2 parasitically formed in the charge power transistor Q2 in the bidirectional connection unit IRU. Meanwhile, as shown in FIG. 8, there is a reverse charging current flowing from the lithium ion battery LIB to the positive terminal Pack+ of the battery pack BPAC via the diode D1 and the diode D2. Furthermore, the reverse charging current includes reverse charging current flowing to the positive terminal Pack+ of the battery pack BPAC via the normally-on power transistor Q3 and reverse charging current flowing from the power supply terminal VCC of the control unit CU to the positive terminal Pack+ of the battery pack BPAC. These reverse charging currents are cut off by the protection diode PD as shown in FIG. 8. Therefore, in the battery pack BPAC, the function of cutting off the reverse charging current is realized by the body diode BD2 in the bidirectional connection unit IRU and the protection diode PD.

<Study of Improvement>

In the battery pack BPAC configured as described above, there is an increasing demand for reducing a thickness of the semiconductor device SA in the battery pack BPAC in order to realize reduction of a thickness of the mobile phone MP and an increase of an occupation rate of the secondary battery in the battery pack BPAC for increasing a charge capacity, for example. In order to satisfy this demand, a technique of embedding the semiconductor chip CHP1, the semiconductor chip CHP2, and the electronic component EPT inside the wiring substrate, as shown in FIG. 2, for example, without providing them on a front surface of the wiring substrate, has been studied. This is because such a configuration that components are embedded inside the wiring substrate can make the thickness of the semiconductor device SA smaller than a configuration in which the components are mounted on the front surface of the wiring substrate.

However, among the electronic components to be embedded in the wiring substrate, the semiconductor chip CHP1 in which the bidirectional connection unit IRU is formed has the discharge power transistor Q1 and the charge power transistor Q2 formed therein as shown in FIG. 3. In the semiconductor chip CHP1 in which the bidirectional connection unit IRU is formed, the discharge power transistor Q1 and the charge power transistor Q2 are reversely connected in series. Therefore, it is necessary to connect the drain of the discharge power transistor Q1 and the drain of the charge power transistor Q2. At this time, in order to connect the drain of the discharge power transistor Q1 and the drain of the charge power transistor Q2 at low resistance, a back surface electrode made of a metal film is formed on a back surface of the semiconductor chip CHP1. Therefore, when embedding the semiconductor chip CHP1 in which the bidirectional connection unit IRU is formed in the wiring substrate, it is necessary to consider not only the adhesion between the silicon which is the main component of the semiconductor chip CHP1 and an embedding member (sealing member), but also the adhesion between the back surface electrode and the embedding member (sealing member). In particular, according to new finding found by the inventor of the present application, the adhesion between the back surface electrode and the embedding member is worse than the adhesion between the silicon and the embedding member. Therefore, in order to improve reliability of a semiconductor device having a structure in which the semiconductor chip CHP1 is embedded in a wiring substrate, it is necessary to devise measures of improving the adhesion between the back surface electrode and the embedding member. In this first embodiment, measures of improving the adhesion between the back surface electrode and the embedding member are taken. In the following description, technical ideas in this embodiment in which such measures are taken will be described with reference to the drawings.

<Configuration of Semiconductor Chip According to First Embodiment>

Figure 9:
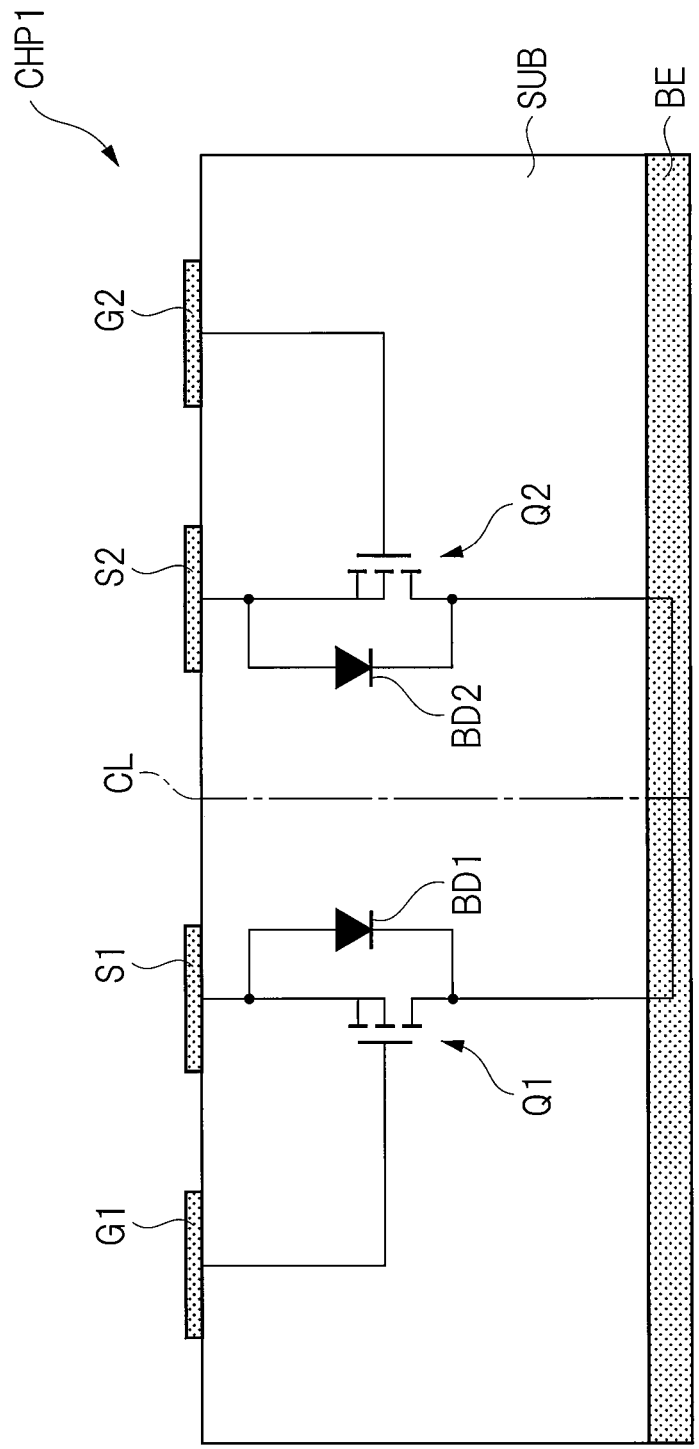
FIG. 9 is a diagram schematically showing a correspondence relation between a semiconductor chip and circuit elements in a first embodiment.

FIG. 9 is a diagram schematically showing a correspondence relation between the semiconductor chip CHP1 and circuit elements in the first embodiment. As shown in FIG. 9, the semiconductor chip CHP1 according to this first embodiment includes, for example, a semiconductor substrate SUB made of silicon. The discharge power transistor Q1 including a power metal oxide semiconductor field effect transistor (MOSFET) and the charge power transistor Q2 including a power MOSFET are formed in this semiconductor substrate SUB. As shown in FIG. 9, on a back surface of the semiconductor substrate SUB, an electrode (back surface electrode BE) is formed. This back surface electrode BE is connected to the drain of the discharge power transistor Q1 and the drain of the charge power transistor Q2. That is, the back surface electrode BE functions as a common drain electrode.

Meanwhile, on a front surface of the semiconductor substrate SUB, an electrode (front surface electrode, source electrode (source pad)) S1 electrically connected to a source of the discharge power transistor Q1 is formed, and an electrode (front surface electrode, gate electrode (gate pad) G1) electrically connected to the gate of the discharge power transistor Q1 is formed. Similarly, on the front surface of the semiconductor substrate SUB, an electrode (front surface electrode, source electrode (source pad) S2) electrically connected to the source of the charge power transistor Q2 is formed, and an electrode (front surface electrode, gate electrode (gate pad) G2) electrically connected to the gate of the charge power transistor Q2 is formed.

Note that, as shown in FIG. 9, the body diode BD1 is parasitically formed in the discharge power transistor Q1 formed in the semiconductor substrate SUB and an anode of the body diode BD1 is electrically connected to the source of the discharge power transistor Q1 as well as a cathode of the body diode BD1 is electrically connected to the drain of the discharge power transistor Q1. Similarly, the body diode BD2 is parasitically formed in the charge power transistor Q2 formed in the semiconductor substrate SUB, and an anode of the body diode BD2 is electrically connected to the source of the charge power transistor Q2 as well as a cathode of the body diode BD2 is electrically connected to the drain of the charge power transistor Q2.

As described above, the discharge power transistor Q1 and the charge power transistor Q2 are formed in the semiconductor chip CHP1 according to this first embodiment, and the discharge power transistor Q1 and the charge power transistor Q2 are reversely connected in series. As a result, the bidirectional connection unit is formed in the semiconductor chip CHP1.

Figure 10:
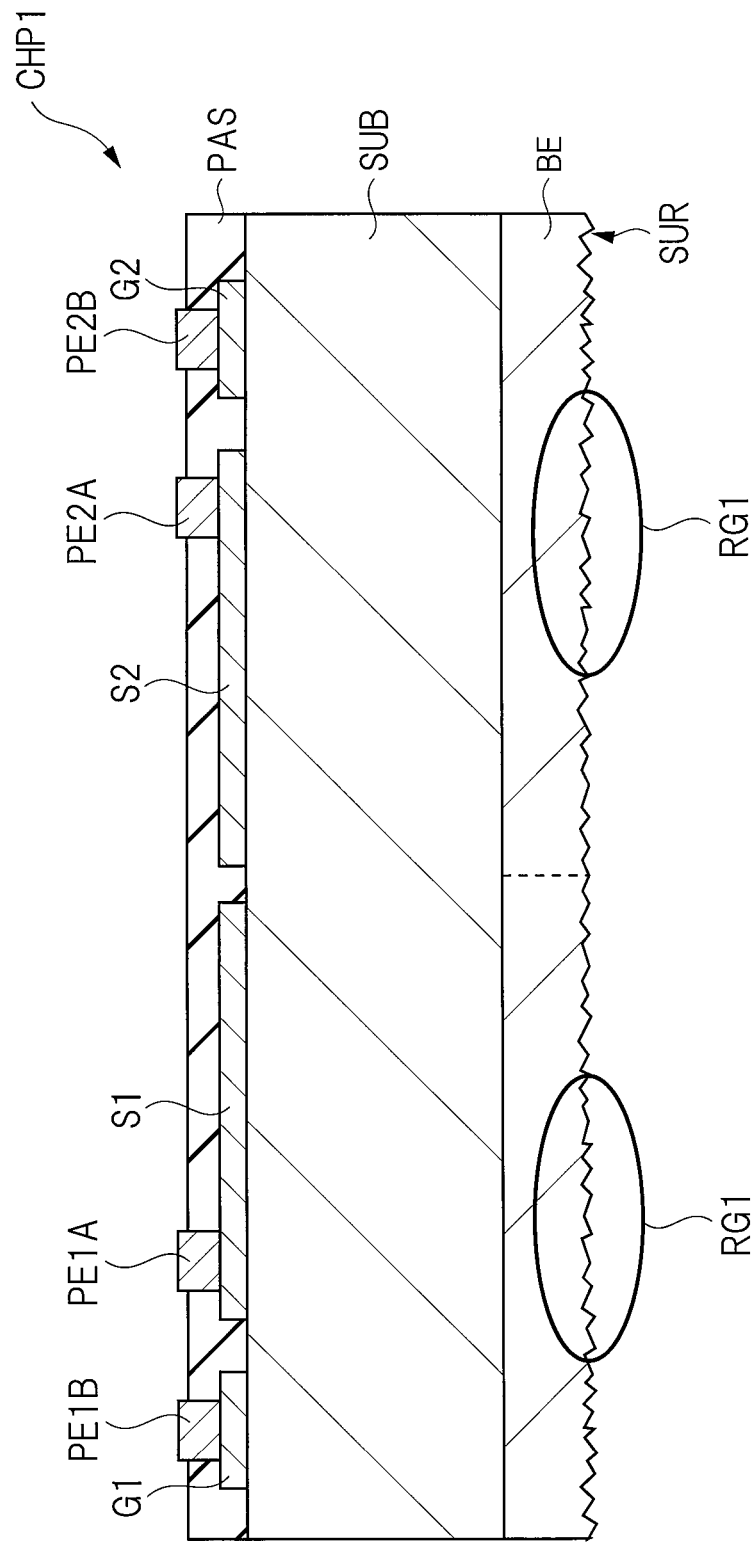
FIG. 10 is a cross-sectional view showing a specific configuration of the semiconductor chip according to the first embodiment.

Next, FIG. 10 is a cross-sectional view showing a specific configuration of the semiconductor chip CHP1 according to the first embodiment. As shown in FIG. 10, the semiconductor chip CHP1 according to this first embodiment includes the semiconductor substrate SUB. The discharge power transistor (not shown) and the charge power transistor (not shown) reversely connected in series with each other are formed in this semiconductor substrate SUB. The back surface electrode BE functioning as the common drain electrode for the discharge power transistor and the charge power transistor is formed on the back surface of the semiconductor substrate SUB. On a front surface of the back surface electrode BE, i.e., a surface of the back surface electrode BE opposite to a surface facing the back surface of the semiconductor substrate SUB (or a surface on the same side as the back surface of the semiconductor substrate SUB) (hereinafter referred to as an "exposed surface SUR"), an uneven shape RG1 is formed.

Meanwhile, on the front surface opposite to the back surface of the semiconductor substrate SUB, the source electrode S1 and the gate electrode G1 are formed. At this time, the source electrode S1 is electrically connected to the source of the discharge power transistor, and the gate electrode G1 is electrically connected to the gate of the discharge power transistor. Also, on the front surface opposite to the back surface of the semiconductor substrate SUB, the source electrode S2 and the gate electrode G2 are also formed. At this time, the source electrode S2 is electrically connected to the source of the charge power transistor, and the gate electrode G2 is electrically connected to the gate of the charge power transistor. Then, as shown in FIG. 10, a front surface protection film (passivation film, insulating film) PAS is formed so as to cover the front surface of the semiconductor substrate SUB. A part of a front surface of the source electrode S1, and a part of a front surface of the source electrode S2 are exposed from the front surface protection film PAS. At this time, a columnar electrode (pillar electrode) PE1A is formed on the front surface of the source electrode S1 exposed from the front surface protection film PAS. On the front surface of the source electrode S2 exposed from the front surface protection film PAS, a columnar electrode PE2A is formed. Similarly, as shown in FIG. 10, a part of a front surface of the gate electrode G1 and a part of a front surface of the gate electrode G2 are exposed from the front surface protection film PAS. On the front surface of the gate electrode G1 exposed from the front surface protection film PAS, a columnar electrode PE1B is formed. On the front surface of the gate electrode G2 exposed from the front surface protection film PAS, a columnar electrode PE2B is formed.

From the above, the semiconductor chip CHP1 according to this first embodiment includes the semiconductor substrate SUB in which a plurality of power transistors are formed. Here, on the front surface (first surface) of the semiconductor substrate SUB, the source electrode (first front surface electrode) S1 electrically connected to the source of the first power transistor (discharge power transistor) out of the plurality of power transistors is formed, and the source electrode (second front surface electrode) S2 electrically connected to the source of the second power transistor (charge power transistor) out of the plurality of power transistors is formed. Also, on the front surface (first surface) of the semiconductor substrate SUB, the gate electrode (first control electrode) G1 electrically connected to the gate of the first power transistor (discharge power transistor) is formed, and the gate electrode (second control electrode) G2 electrically connected to the gate of the second power transistor (charge power transistor) is formed. Meanwhile, on the back surface (second surface) opposite to the front surface of the semiconductor substrate SUB, the back surface electrode (common drain electrode) BE electrically connected to the drain of the first power transistor (discharge power transistor) and the drain of the second power transistor (charge power transistor) is formed. At this time, the uneven shape RG1 is formed on the exposed surface (lower surface) SUR of the back surface electrode BE.

Next, a material of each component constituting the semiconductor chip CHP1 according to this first embodiment will be described. First, the semiconductor substrate SUB is made of silicon, and inside the semiconductor substrate SUB, an n-type semiconductor region in which n-type impurities such as phosphorus (P) and arsenic (As) are doped into silicon, and a p-type semiconductor region in which p-type impurities such as boron (B) are doped into silicon are formed, for example.

Subsequently, the back surface electrode BE is formed, for example, of a layered film including a titanium film (Ti film), a nickel film (Ni film) formed on the titanium film, and a silver film (Ag film) formed on the nickel film. However, the back surface electrode BE is not limited thereto. For the back surface electrode, a nickel film may be further formed on the silver film, taking into account marking of signs with a laser on the exposed surface SUR of the back surface electrode BE. Alternatively, the back surface electrode BE may also be formed of a layered film including a titanium film and a copper film (Cu film).

The source electrode S1 and the source electrode S2 are formed of, for example, an aluminum film or an aluminum alloy film. Likewise, the gate electrode G1 and the gate electrode G2 are also formed of, for example, an aluminum film or an aluminum alloy film. That is, the source electrodes S1 and S2 and the gate electrodes G1 and G2 are formed of an aluminum film or an aluminum alloy film formed in the same layer. Furthermore, a columnar electrode PE1A formed on the source electrode S1, a columnar electrode PE1B formed on the gate electrode G1, a columnar electrode PE2A formed on the source electrode S2, and a columnar electrode PE2B formed on the gate electrode G2 are each mainly composed of a copper film. Meanwhile, the front surface protection film PAS is constructed of an insulating film such as a silicon oxide film or a silicon nitride film, for example.

Next, a dimension (thickness) of each of the main components constituting the semiconductor chip CHP1 according to this first embodiment will be described. First, a thickness of the semiconductor substrate SUB is, for example, substantially 100 μm to 200 μm. In addition, a thickness of each of the source electrodes S1 and S2 and the gate electrodes G1 and G2 formed on the front surface of the semiconductor substrate SUB is, for example, substantially 4 μm to 5 μm. Meanwhile, a thickness of the back surface electrode BE formed on the back surface of the semiconductor substrate SUB is, for example, substantially 10 μm to 30 μm. A difference (unevenness) between a top and a bottom of a projection of the uneven shape RG1 formed on the exposed surface SUR of the back surface electrode BE is, for example, substantially 3 μm to 5 μm.

Therefore, in the semiconductor chip CHP1 according to this first embodiment, the thickness of the back surface electrode BE is larger than the thickness of each of the source electrodes S1 and S2 and the gate electrodes G1 and G2. Also, a surface roughness of the exposed surface SUR of the back surface electrode BE where the uneven shape RG1 is formed is rougher than a surface roughness of the front surface of each of the source electrodes S1 and S2 and the gate electrodes G1 and G2. That is, in this first embodiment, the uneven shape is intentionally formed on the exposed surface SUR of the back surface electrode BE, whereas an uneven shape is not intentionally formed on the front surface of each of the source electrodes S1 and S2 and the gate electrodes G1 and G2. Therefore, even if unintended uneven shapes are formed on the front surface of each of the source electrodes S1 and S2 and the gate electrodes G1 and G2 by etching in a manufacturing process, the uneven shape formed on the front surface of each of the source electrodes S1 and S2 and the gate electrodes G1 and G2 is smaller than the uneven shape RG1 intentionally formed on the exposed surface SUR of the back surface electrode BE. In other words, the uneven shape RG1 intentionally formed on the exposed surface SUR of the back surface electrode BE is larger than the uneven shape formed on the front surface of each of the source electrodes S1 and S2 and the gate electrodes G1 and G2. As a result, the surface roughness of the exposed surface SUR of the back surface electrode BE is rougher than the surface roughness of the front surface of each of the source electrodes S1 and S2 and the gate electrodes G1 and G2. As described above, the semiconductor chip CHP1 according to this first embodiment is configured.

<Device Structure of Semiconductor Chip>

Next, a device structure of each power transistor formed in the semiconductor chip CHP1 according to this first embodiment will be described.

Figure 11:
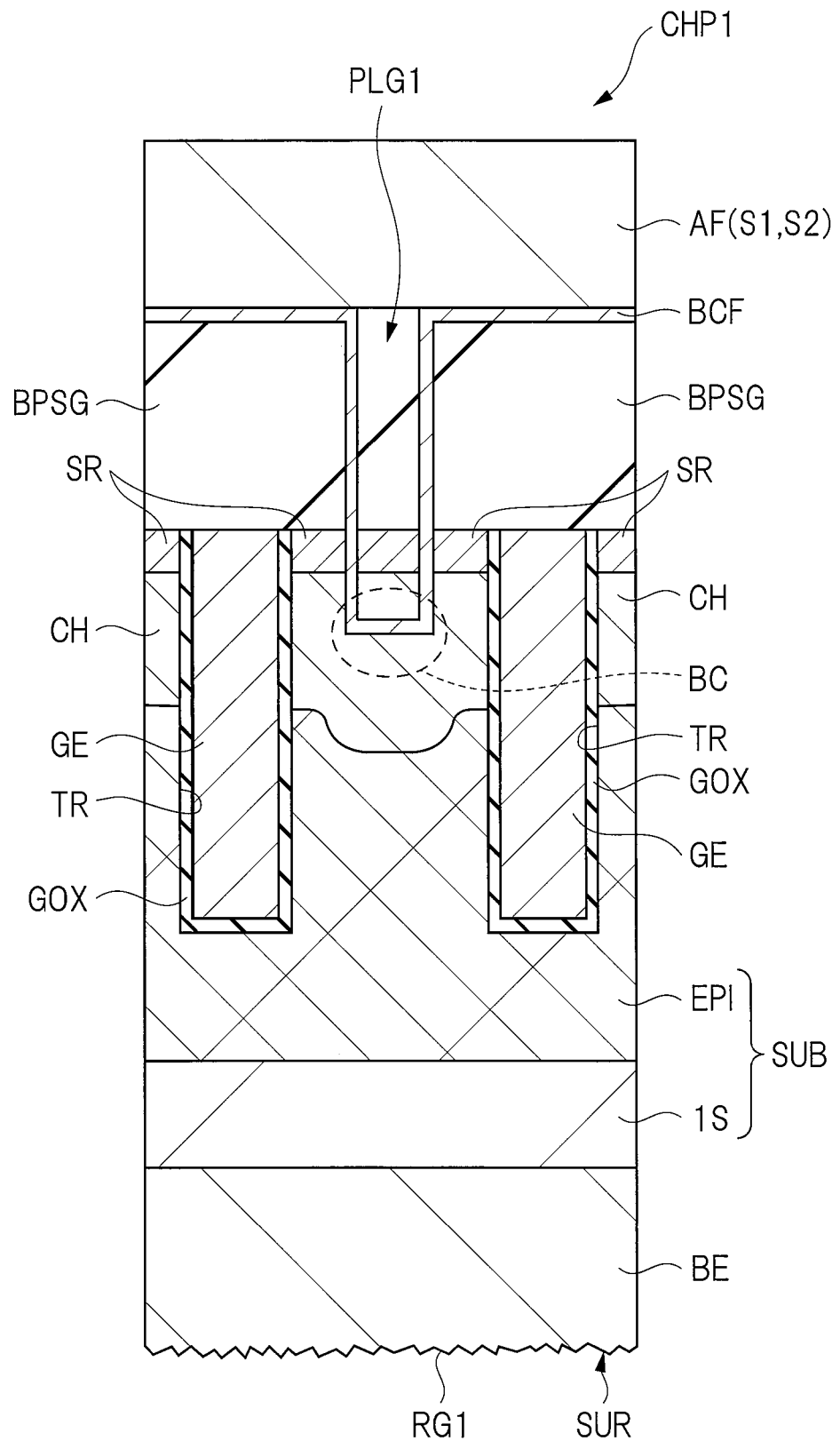
FIG. 11 is a cross-sectional view showing an example of a device structure of a unit transistor formed in a cell forming region.

In the semiconductor chip CHP1 in the present embodiment, for example, as shown in FIG. 9, the discharge power transistor Q1 and the charge power transistor Q2 formed of a vertical transistor flowing current in a thickness direction of the semiconductor chip CHP1 are formed. More specifically, in FIG. 9, the discharge power transistor Q1 is formed in the left side region of a center line CL. The charge power transistor Q2 is formed in the right side region of the center line CL. The back surface electrode BE shown in FIG. 9 functions as the drain of the discharge power transistor Q1 formed in the left side region of the center line CL and also functions as the drain of the charge power transistor Q2 formed in the right side region of the center line CL. That is, the drain of the discharge power transistor Q1 and the drain of the charge power transistor Q2 formed in the semiconductor chip CHP1 are electrically connected. Here, the device structure of the discharge power transistor Q1 is equal to the device structure of the charge power transistor Q2. Therefore, in the following description, for example, the device structure of the power transistor will be described focusing on the discharge power transistor Q1. The discharge power transistor Q1 is configured by connecting several thousands to hundreds of thousands of unit transistors (cell transistors) in parallel. In FIG. 11 described below, the device structure of the discharge power transistor Q1 will be described by taking two adjacent unit transistors as an example.

FIG. 11 is a cross-sectional view showing an example of the device structure of the unit transistor formed in a cell forming region. In FIG. 11, for example, an epitaxial layer EPI is formed on a substrate layer 1S made of silicon containing n-type impurities such as phosphorus (P) and arsenic (As). This epitaxial layer EPI is formed of a semiconductor layer containing silicon as a main component into which n-type impurities such as phosphorus (P) and arsenic (As) are doped, for example. The substrate layer 1S and the epitaxial layer EPI are components functioning as the drains of the power transistors (discharge power transistor Q1 and charge power transistor Q2). Note that, in this first embodiment, as shown in FIG. 11, combination of the substrate layer 1S and the epitaxial layer EPI is referred to as the semiconductor substrate SUB.

Next, an element portion is formed in a front surface of the epitaxial layer EPI. More specifically, in the element portion according to this first embodiment, a channel region CH is formed in the front surface of the epitaxial layer EPI. A trench TR penetrating this channel region CH and reaching the epitaxial layer EPI is formed. At this time, a gate insulating film GOX is formed on an inner wall of the trench TR. A gate GE is formed so as to bury the trench TR over this gate insulating film GOX. The gate insulating film GOX is formed of, for example, a silicon oxide film, but the gate insulating film GOX is not limited thereto. The gate insulating film GOX may be formed of a high dielectric constant film having a dielectric constant higher than, for example, a silicon oxide film. Further, the gate GE is formed of, for example, a polysilicon film.

Subsequently, a source region SR is formed in a front surface of the channel region CH adjacent to the trench TR. An insulating film BPSG is formed over an upper surface of the trench RE in which the gate GE is embedded and over the source region SR. The channel region CH includes a semiconductor region into which p-type impurities such as boron (B) are doped, for example, and the source region SR includes a semiconductor region into which n-type impurities such as phosphorus (P) and arsenic (As) are doped, for example.

Next, between the mutually adjacent trenches TR, a groove penetrating the insulating film BPSG and the source region SR and reaching the channel region CH is formed, and a body contact region BC is formed at a bottom of this groove. This body contact region BC includes a semiconductor region into which p-type impurities such as boron (B) are doped, for example, and an impurity concentration of the body contact region BC is higher than an impurity concentration of the channel region CH.

Subsequently, a plug PLG1 made of a barrier conductor film BCF and a tungsten film is formed so as to bury the groove having the body contact region BC formed at the bottom thereof. The barrier conductor film BCF and the aluminum alloy film AF are formed over an insulating film BPSG. As a result, the aluminum alloy film AF is electrically connected with the source region SR and also electrically connected with the channel region CH via the body contact region BC. That is, the aluminum alloy film AF shown in FIG. 11 constitutes, for example, the source electrode S1 (the source electrode S2) shown in FIG. 10.

At this time, the body contact region BC has a function of securing ohmic contact with the plug PLG1. Due to presence of this body contact region BC, the source region SR and the channel region CH are electrically connected at the same potential.

Therefore, it is possible to suppress ON operation of a parasitic npn bipolar transistor having the source region SR as an emitter region, the channel region CH as a base region, and the epitaxial layer EPI as a collector region. That is, the fact that the source region SR and the channel region CH are electrically connected at the same potential means that there is no potential difference between the emitter region and the base region of the parasitic npn bipolar transistor, so that this can suppress the ON operation of the parasitic npn bipolar transistor.

Next, as shown in FIG. 11, on a back surface of the substrate layer 1S, the back surface electrode BE is formed. On the exposed surface SUR of this back surface electrode BE, the uneven shape RG1 intentionally formed is present.

As described above, the device structure of the power transistor (the discharge power transistor Q1 or the charge power transistor Q2) is formed inside the semiconductor chip CHP1 according to the present embodiment.

Note that, in the power transistor formed inside the semiconductor chip CHP1, the body diode which is a parasitic diode is formed by the epitaxial layer EPI which is an n-type semiconductor layer and the channel region CH which is a p-type semiconductor layer. That is, the body diode which is a pn junction diode having the channel region CH as the anode and the epitaxial layer EPI as the cathode is formed between the epitaxial layer EPI and the channel region CH.

<Configuration of Semiconductor Device According to First Embodiment>

Figure 12:
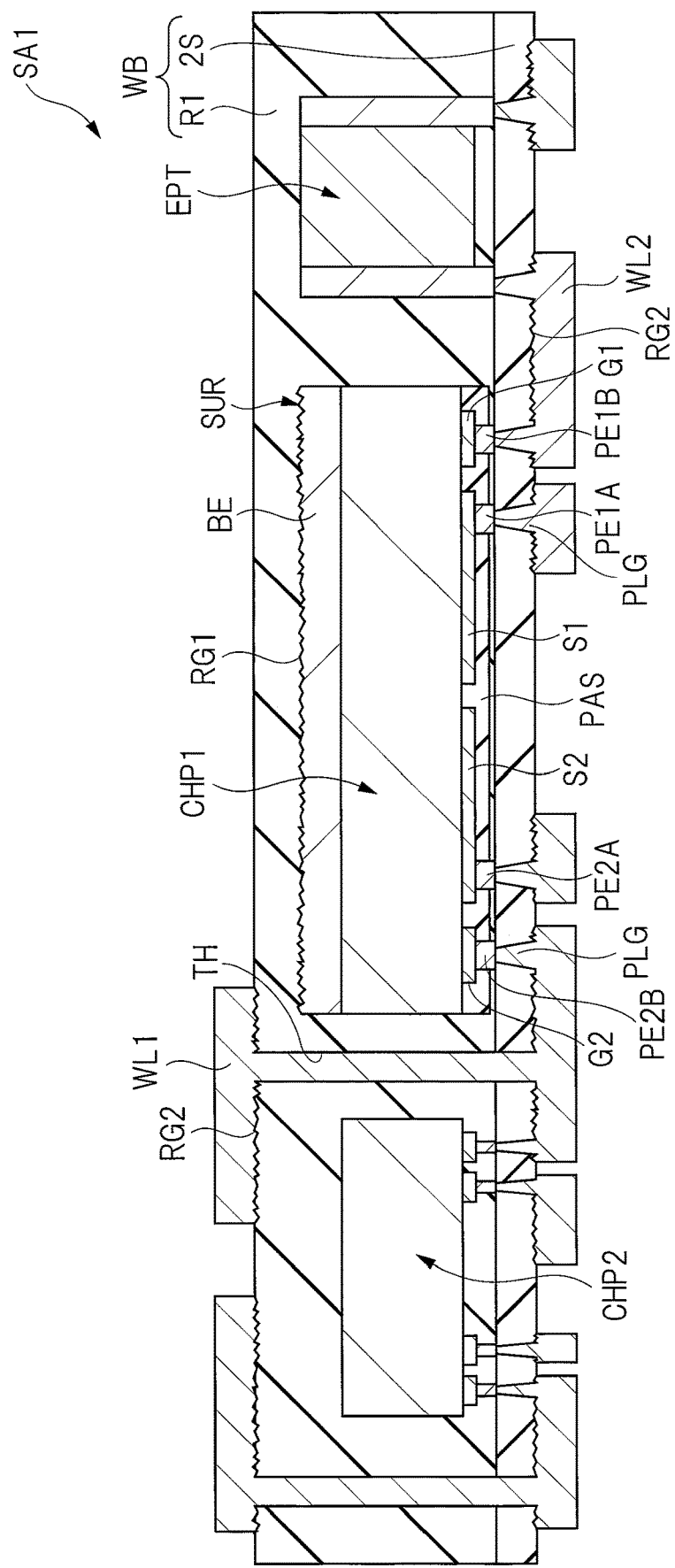
FIG. 12 is a cross-sectional view showing a configuration of a semiconductor device according to the first embodiment.

Next, a configuration example of the semiconductor device according to this first embodiment will be described. FIG. 12 is a cross-sectional view showing a configuration of a semiconductor device SA1 according to the first embodiment. As shown in FIG. 12, a plurality of electronic components including a semiconductor component are mounted on a substrate 2S. More specifically, the semiconductor chip CHP1, the semiconductor chip CHP2, and the electronic component EPT such as a capacitor or a resistive element are mounted over the substrate 2S. Here, the semiconductor device SA1 according to this first embodiment includes, for example, the semiconductor chip CHP1 in which the bidirectional connection unit IRU shown in FIG. 4 is formed, the semiconductor chip CHP2 in which the control unit CU is formed, and the electronic component EPT including other passive components. Therefore, the semiconductor device SA1 according to this first embodiment is a semiconductor device controlling charge and discharge of the lithium ion battery LIB which is an example of a chargeable and dischargeable secondary battery.

As shown in FIG. 12, the semiconductor chip CHP1 is connected with the substrate 2S in a state in which a front surface of the semiconductor chip CHP1 faces an upper surface of the substrate 2S (facedown mounting). More specifically, the semiconductor chip CHP1 is mounted over the substrate 2S such that each of a columnar electrode PE1A formed on the source electrode S1, a columnar electrode PE1B formed on the gate electrode G1, a columnar electrode PE2A formed on the source electrode S2, and a columnar electrode PE2B formed on the gate electrode G2 is connected to a terminal (not shown) formed in the substrate 2S. Similarly, the semiconductor chip CHP2 is connected with the substrate 2S in a state in which a front surface of the semiconductor chip CHP2 faces the upper surface of the substrate 2S. In addition, the electronic component EPT is mounted over the substrate 2S such that a terminal of the electronic component EPT is connected to a terminal of the substrate 2S.

In the substrate 2S, a plug PLG that electrically connects with a terminal formed in the upper surface of the substrate 2S is formed so as to penetrate the substrate 2S. Also, a plurality of wirings WL2 are formed on a lower surface of the substrate 2S, and the plug PLG and the wiring WL2 are electrically connected. Therefore, the terminal formed in the upper surface of the substrate 2S and the wiring WL2 formed on the lower surface of the substrate 2S are electrically connected via the plug PLG.

Meanwhile, a resin sealing member R1 is formed so as to cover the semiconductor chip CHP1, the semiconductor chip CHP2, and the electronic component EPT mounted over the upper surface of the substrate 2S. A through hole TH is formed so as to penetrate the resin sealing member R1 and the substrate 2S. Furthermore, on a front surface of the resin sealing member R1, a plurality of wirings WL1 are formed. This wiring WL1 is electrically connected with the wiring WL2 formed on the lower surface of the substrate 2S via the through hole TH. In the semiconductor device SA1 according to this first embodiment configured as described above, as shown in FIG. 12, the semiconductor chip CHP1, the semiconductor chip CHP2, and the electronic component EPT are embedded inside a wiring substrate WB including the substrate 2S and the resin sealing member R1.

Next, in FIG. 12, the back surface electrode BE formed in the semiconductor chip CHP1 is in contact with the resin sealing member R1. A surface of the back surface electrode BE which is in contact with the resin sealing member R1 has the uneven shape RG1. Meanwhile, for example, the uneven shape RG2 is also formed on a surface of the wiring WL1 in contact with of the resin sealing member R1. The uneven shape RG2 is also formed on a surface of the wiring WL1 in contact with of the resin sealing member R1. At this time, a surface roughness of the surface, which is in contact with the resin sealing member R1, of the back surface electrode BE where the uneven shape RG1 is formed is equivalent to a surface roughness of the front surface of each of the wiring WL1 and the wiring WL2 where the uneven shape RG2 is formed. In other words, the difference (unevenness) between the top and the bottom of the projection of the uneven shape RG1 formed on the back surface electrode BE is equivalent to difference between a top and a bottom of a projection of the uneven shape RG2 formed on the wiring WL1 and the wiring WL2. However, in this first embodiment, the uneven shape RG1 is always formed on the surface, which is in contact with the resin sealing member R1, of the back surface electrode BE, while the wiring WL1 and the wiring WL2 do not necessarily have the uneven shape RG2 formed thereon. Therefore, in this case, it can be said that the surface roughness of the surface, which is in contact with the resin sealing member R1, of the back surface electrode BE where the uneven shape RG1 is formed is rougher than the surface roughness of each of the front surface of the wiring WL1 and the front surface of the wiring WL2.

Subsequently, as shown in FIG. 12, an external size of the semiconductor chip CHP1 is larger than an external size of the semiconductor chip CHP2, and in particular, a thickness of the semiconductor chip CHP1 is larger than a thickness of the semiconductor chip CHP2. This is because the power transistor is formed in the semiconductor chip CHP1, whereas an integrated circuit such as a logic circuit as a representative is formed in the semiconductor chip CHP2. That is, several thousands to several hundreds of thousands of unit transistors are formed in the semiconductor chip CHP1, and a thick epitaxial layer is formed in order to secure a withstand voltage. Therefore, the semiconductor chip CHP1 has a larger external size than the semiconductor chip CHP2 in which an integrated circuit with low power consumption such as a logic circuit as a representative is formed. In other words, the semiconductor chip CHP1 in which the power transistor is formed handles a larger current than the semiconductor chip CHP2 in which the integrated circuit is formed and needs to ensure a higher withstand voltage than the semiconductor chip CHP2. Therefore, the external size of the semiconductor chip CHP1 is larger than the external size of the semiconductor chip CHP2.

Next, in FIG. 12, the thickness of the back surface electrode BE formed in the semiconductor chip CHP1 is substantially the same as a thickness of the wiring WL and a thickness of the wiring WL2 formed in the wiring substrate WB. Here, as described above, the back surface electrode BE formed in the semiconductor chip CHP1 is formed of a layered film of a titanium film, a nickel film, and a silver film, but is not limited thereto. The back surface electrode BE formed in the semiconductor chip CHP1 can also be formed of a layered film of a titanium film and a copper film which is the same material as the wiring WL1 and the wiring WL2. That is, metal films with low resistivity can be widely applied to the back surface electrode BE.

Features According to First Embodiment

Next, feature points of this first embodiment will be described. First, the first feature point of this first embodiment is in that, for example, as shown in FIG. 12, the semiconductor chip CHP1 in which the power transistor is formed is embedded inside the wiring substrate WB. Thus, according to this first embodiment, the semiconductor device SA1 can be made thinner than a configuration in which the semiconductor chip CHP1 is mounted on the wiring substrate WB.

For example, in the configuration in which the semiconductor chip CHP1 is mounted on the wiring substrate WB, a thickness of the entire semiconductor device including the wiring substrate WB and the semiconductor chip CHP1 is a sum of a thickness of the wiring substrate WB itself and the thickness of the semiconductor chip CHP1, and furthermore, considering that it is necessary to seal the semiconductor chip CHP1 with a sealing member, a thickness of the sealing member covering the semiconductor chip CHP1 is also added. As a result, in the configuration where the semiconductor chip CHP1 is mounted on the wiring substrate WB, it is difficult to reduce the thickness of the semiconductor device.

In contrast, in the semiconductor device SA1 according to this first embodiment, as shown in FIG. 12, the semiconductor chip CHP1 in which a power transistor is formed is embedded inside the wiring substrate WB (first feature point). As a result, the thickness of the entire semiconductor device SA1 according to this first embodiment is equivalent to the thickness of the wiring substrate WB, which makes it possible to reduce the thickness of the semiconductor device SA1. In particular, in this first embodiment, since the semiconductor chip CHP1 is embedded inside the wiring substrate WB, the wiring substrate WB itself functions as a sealing member covering the semiconductor chip CHP1. As a result, in the semiconductor device SA1 according to this first embodiment, there is no need to newly provide a sealing member covering the semiconductor chip CHP1. Therefore, according to this first embodiment, there is no need to consider a thickness of a sealing member to be newly formed, and the semiconductor device SA1 can be made thinner by a thickness equivalent to the thickness of this sealing member.

That is, according to the first feature point of this first embodiment, as a direct effect of embedding the semiconductor chip CHP1 inside the wiring substrate WB, the thickness of the semiconductor device SA1 can be defined only by the thickness of the wiring substrate WB, almost irrespective of the thickness of the semiconductor chip CHP1, which makes it possible to reduce the thickness of the semiconductor device SA1.

Also, according to the first feature point of this first embodiment, as an indirect effect of embedding the semiconductor chip CHP1 inside the wiring substrate WB, the wiring substrate WB itself functions as a sealing member for protecting the semiconductor chip CHP1, and this eliminates the necessity of providing a new sealing member for sealing the semiconductor chip CHP1. This means that there is no need to consider an increase in thickness due to the provision of a new sealing member, and this also makes it possible to reduce the thickness of the semiconductor device SA1. Furthermore, as a secondary effect, since there is no need to use a new sealing member, an effect that manufacturing costs of the semiconductor device SA1 can be reduced is also obtained.

As described above, according to the first feature point of this first embodiment, due to a synergistic effect resulting from the direct effect and the indirect effect caused by embedding the above-mentioned semiconductor chip CHP1 inside the wiring substrate WB, it is possible to obtain a remarkable effect that the semiconductor device SA1 can be made thinner. As a result, for example, by using the semiconductor device SA1 of this first embodiment for a battery pack, it is possible to realize a thinner battery pack. Thus, according to this first embodiment, it is possible to provide the semiconductor device SA1 that contributes to thinning of a mobile phone and an increase in occupation ratio of a secondary battery in a battery pack for increasing a charge capacity.

Furthermore, according to the first feature point of this first embodiment, the following advantages can also be obtained. For example, in a configuration where an electronic component including the semiconductor chip CHP1 is mounted on the front surface of the wiring substrate WB, it is necessary to form an underfill resin or a fillet of a solder material in order to improve connection reliability between the wiring substrate WB and the electronic component. Therefore, in this case, it is necessary to secure not only a mounting region of the electronic component but also a region forming the underfill resin or the fillet of the solder material, as a mounting region of the electronic component. In contrast, according to the first feature point of this first embodiment, the electronic component is embedded inside the wiring substrate WB, and in this case, it is not necessary to form the underfill resin or the fillet of the solder material. Therefore, according to this first embodiment, it is unnecessary to secure the region for forming the underfill resin or the fillet of the solder material, and as a result, the size of the semiconductor device SA1 can be reduced. That is, the first feature point of this first embodiment is useful for not only reducing the thickness of the semiconductor device SA1 but also reducing the size of the semiconductor device SA1.

Next, the second feature point of this first embodiment is in that, for example, as shown in FIG. 12, the back surface electrode BE is formed on the back surface of the semiconductor chip CHP1 in which the power transistor is formed, and the thickness of the back surface electrode BE is larger than the thickness of each of the source electrodes S1 and S2 formed on the front surface of the semiconductor chip CHP1. As a result, it is possible to reduce ON resistance of the power transistor formed in the semiconductor chip CHP1.

More specifically, the bidirectional connection unit is formed in the semiconductor chip CHP1 according to this first embodiment and includes the discharge power transistor and the charge power transistor reversely connected in series with each other. That is, since the discharge power transistor and the charge power transistor are reversely connected in series, the drain of the discharge power transistor and the drain of the charge power transistor are electrically connected. That is, in this first embodiment, due to the epitaxial layer which functions as the drain of the discharge power transistor and also as the drain of the charge power transistor, the drain of the discharge power transistor and the drain of the charge power transistor are electrically connected. However, since the epitaxial layer is the semiconductor layer, the ON resistance becomes large when the drain of the discharge power transistor and the drain of the charge power transistor are electrically connected only by the epitaxial layer. From this fact, in this first embodiment, the back surface electrode BE formed of, for example, a low resistance metal film is formed on the back surface of the semiconductor chip CHP1. As a result, the drain of the discharge power transistor and the drain of the charge power transistor are electrically connected not only by the epitaxial layer but also by the low resistance back surface electrode BE, so that the ON resistance can be reduced.

In particular, in this first embodiment, the thickness of the back surface electrode BE is increased in order to increase an effect of reducing the ON resistance. This is because, as the thickness of the back surface electrode BE is increased, the resistance of the back surface electrode BE decreases. More specifically, in this first embodiment, the thickness of the back surface electrode BE is larger than the thickness of each of the source electrodes S1 and S2 formed on the front surface of the semiconductor chip CHP1. Thus, the ON resistance of the semiconductor chip CHP1 functioning as a bidirectional connection unit can be reduced. However, from the viewpoint of reducing the ON resistance, it is desirable to increase the thickness of the back surface electrode BE. However, if the thickness of the back surface electrode BE is made too large, the wiring substrate WB tends to warp due to difference in linear expansion coefficient from the wiring substrate WB in which the semiconductor chip CHP1 is embedded. For this reason, for example, in this first embodiment, in order to reduce the ON resistance, it is necessary to make the thickness of the back surface electrode BE larger than the thickness of each of the source electrodes S1 and S2, whereas the thickness of the back surface electrode BE is made to be smaller than substantially 30 μm in order to suppress warpage occurring in the wiring substrate WB. As a result, according to this first embodiment, it is possible to obtain a remarkable effect that the ON resistance can be reduced, suppressing warpage occurring in the wiring substrate WB.

As described above, the semiconductor device SA1 of this first embodiment has the above-described first feature point and second feature point, which makes it possible to improve performance of the semiconductor device SA1 by reducing the thickness and the size of the semiconductor device SA1 and reducing the ON resistance of the semiconductor device SA1.

However, in realizing the semiconductor device SA1 having the first feature point and the second feature point, there are matters to be improved from the viewpoint of adhesion between the back surface electrode BE and the wiring substrate WB. More specifically, according to the study of the inventor of the present application, the adhesion between the back surface electrode BE and the embedding member (wiring substrate WB) is worse than the adhesion between silicon and the embedding member. Therefore, in order to improve the reliability of the semiconductor device having the structure in which the semiconductor chip CHP1 is embedded in the wiring substrate WB, it is necessary to devise measures of improving the adhesion between the back surface electrode BE and the embedding member. That is, when thermal stress or mechanical stress is applied to the wiring substrate WB in which the semiconductor chip CHP1 is embedded, the back surface electrode BE is peeled off from the embedding member, resulting in reduction in reliability of the semiconductor device SA1. In particular, this peeling is likely to be caused by the fact that the adhesion between the back surface electrode BE and the embedding material is not so good and by the fact that, for example, as shown in FIG. 12, the external size of the semiconductor chip CHP1 is larger than the external size of the semiconductor chip CHP2. That is, as a result of synergistic factors due to the fact that a contact area between the back surface electrode BE and the embedding material is increased and the fact that the thickness of the back surface electrode BE is made large, the peeling between the back surface electrode BE and the wiring substrate WB is likely to become apparent. That is, in the semiconductor chip CHP1 in which the power transistor is formed, peeling from the wiring substrate is likely to be more apparent than the semiconductor chip CHP2 because the back surface electrode BE having poor adhesion to the embedding material is formed on the back surface of the semiconductor chip CHP1, the thickness of the back surface electrode BE is formed to be large, and the external size of the semiconductor chip CHP1 becomes large. Therefore, in this first embodiment, focusing on the semiconductor chip CHP2 where the peeling is likely to be apparent, the measure of improving the adhesion between the back surface electrode BE and the embedding member is taken, and this devised measure is the third feature point of this first embodiment. This third feature point will be described below.

The third feature point according to this first embodiment is in that, for example, as shown in FIG. 12, the uneven shape RG1 is intentionally formed on the surface of the back surface electrode BE which is in contact with the embedding member (wiring substrate WB). Thus, according to the third feature point of this first embodiment, the adhesion between the back surface electrode BE and the wiring substrate WB can be improved by an anchor effect caused by the uneven shape RG1 formed on the back surface electrode BE. This means that peeling of the semiconductor chip CHP1 from the wiring substrate WB is effectively suppressed by improving the adhesion between the back surface electrode BE and the wiring substrate WB, whereby the reliability of the semiconductor device SA1 can be improved.

In particular, from the viewpoint of increasing the anchor effect and improving the adhesion between the back surface electrode BE and the wiring substrate WB, the uneven shape RG1 formed on the back surface electrode BE preferably has a large difference between the top and the bottom of the projection. More specifically, the difference (unevenness) between the top and the bottom of the projection of the uneven shape RG1 can be substantially 3 µm to 5 µm. Here, for example, as shown in FIG. 12, in order to improve the adhesion to the wiring substrate WB, the uneven shape RG2 may also be formed on the wiring WL1 and the wiring WL2 formed in the wiring substrate WB. In this case, the uneven shape RG1 formed on the back surface electrode BE can be equivalent to the uneven shape RG2 formed on the wiring WL1 and the wiring WL2.

Note that the wiring WL1 and the wiring WL2 formed in the wiring substrate WB are made of materials having good adhesion from the viewpoint of improving the adhesion to the wiring substrate WB (epoxy resin). Therefore, when the material of the back surface electrode BE formed on the back surface of the semiconductor chip CHKP1 is made of the same material as the materials of the wiring WL1 and the wiring WL2, the adhesion to the wiring substrate WB can be further improved. For example, the wiring WL1 and the wiring WRL2 are formed of a layered film including a titanium film and a copper film. Therefore, instead of a layered film of a titanium film, a nickel film, and a silver film, the back surface electrode BE can be also formed of a layered film including a titanium film and a copper film. In this case, the copper constituting the copper film has an electrical resistivity as low as that of silver and is cheaper than silver, so that it is also possible to reduce the manufacturing costs of the semiconductor device SA1.

<Manufacturing Method of Semiconductor Chip>

Next, a manufacturing method of a semiconductor chip according to this first embodiment will be described.

1. Preparation Process of Semiconductor Wafer

Figure 13:
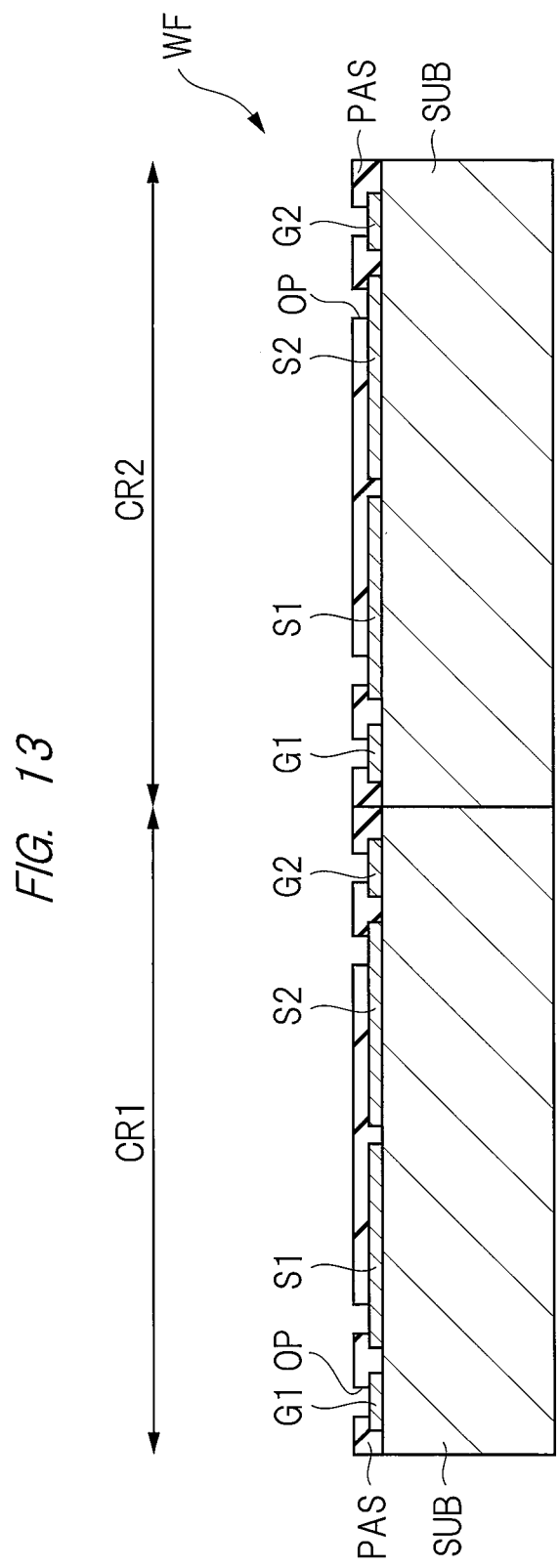
FIG. 13 is a cross-sectional view showing a manufacturing step of the semiconductor chip according to the first embodiment.

First, as shown in FIG. 13, a semiconductor wafer WF is prepared. FIG. 13 illustrates a chip forming region CR1 and a chip forming region CR2 included in the semiconductor wafer WF. In the semiconductor wafer WF shown in FIG. 13, the following device structure has already been formed by a device forming process executed before the process to be described. That is, in the semiconductor wafer WF, both the discharge power transistor and the charge power transistor which are reversely connected in series with each other are formed in the semiconductor substrate SUB of each of the chip forming region CR1 and the chip forming region CR2. The source electrode S1 electrically connected to the source of the discharge power transistor and the gate electrode G1 electrically connected to the gate of the discharge power transistor are formed on the front surface of the semiconductor substrate SUB of each of the chip forming region CR1 and the chip forming region CR2. Likewise, the source electrode S2 electrically connected to the source of the charge power transistor and the gate electrode G2 electrically connected to the gate of the charge power transistor are formed on the front surface of the semiconductor substrate SUB of each of the chip forming region CR1 and the chip forming region CR2. Furthermore, a front surface protection film PAS is formed so as to cover the source electrodes S1 and S2 and the gate electrodes G1 and G2, and the front surface protection film PAS has an opening portion OP which exposes a part of the front surface of each of the source electrodes S1 and S2 and the gate electrodes G1 and G2 formed therein.

2. Forming Process of Columnar Electrode

Figure 14:
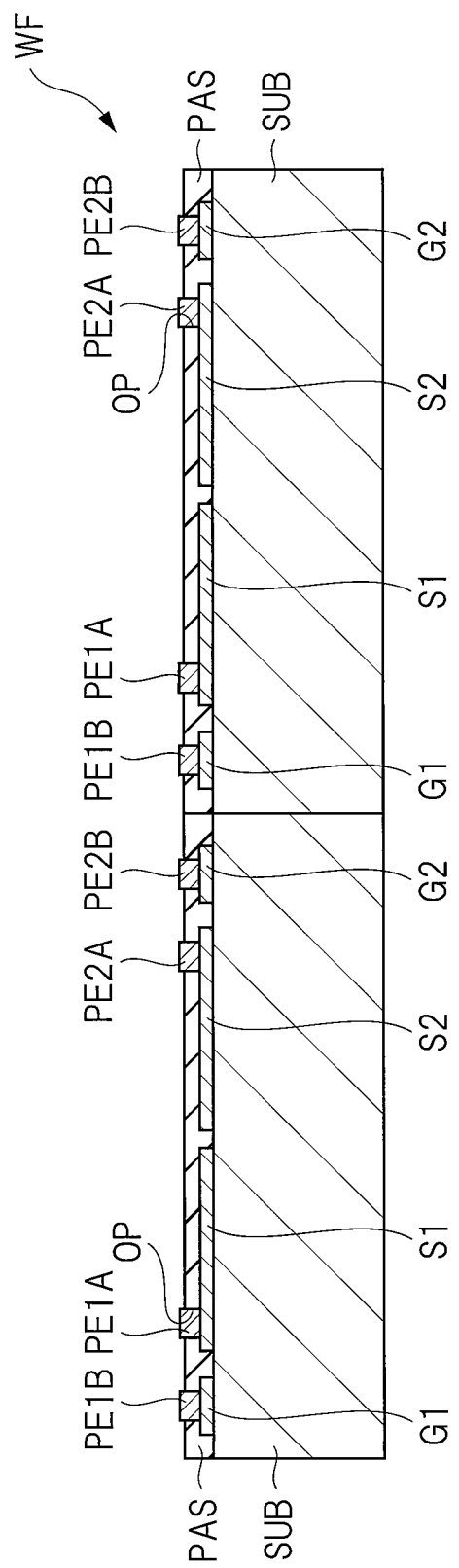
FIG. 14 is a cross-sectional view showing the manufacturing step of the semiconductor chip continued from FIG. 13.

Subsequently, as shown in FIG. 14, a columnar electrode (Cu pillar electrode) is formed so as to fill the opening portion OP formed in the front surface protection film PAS. More specifically, a columnar electrode PE1A is formed on the front surface of the source electrode S1 exposed in the opening portion OP, and a columnar electrode PE1B is formed on the front surface of the gate electrode G1 exposed in the opening portion OP. Likewise, a columnar electrode PE2A is formed on the front surface of the source electrode S2 exposed in the opening portion OP, and a columnar electrode PE2B is formed on the front surface of the gate electrode G2 exposed in the opening portion OP. These columnar electrodes PE1A to PE2B have a columnar shape made of copper having a height of substantially 10 µm to 20 µm.

3. Semiconductor Wafer Grinding Process

Figure 15:
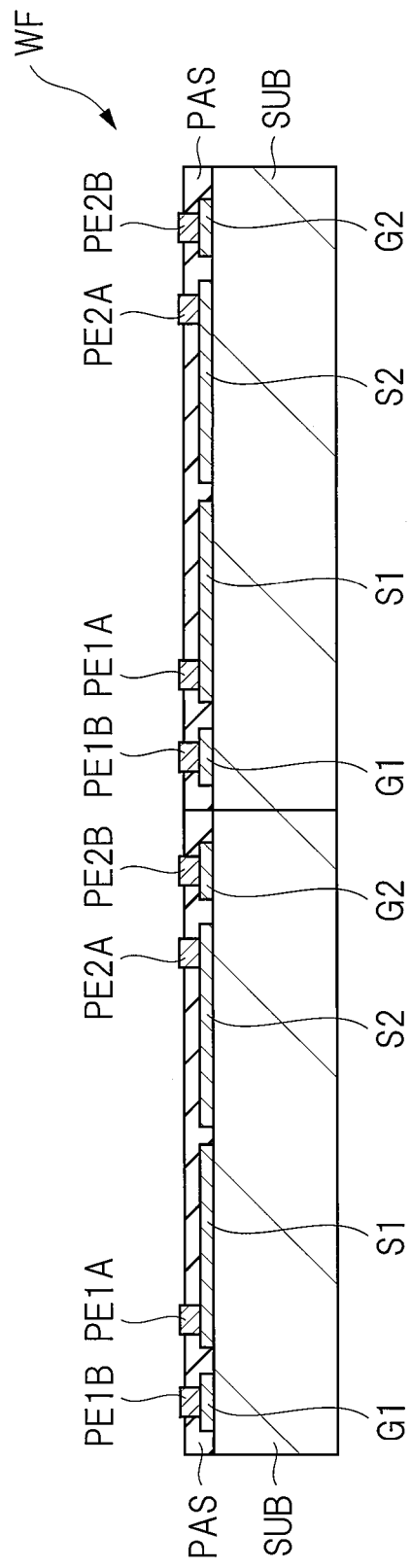
FIG. 15 is a cross-sectional view showing the manufacturing step of the semiconductor chip continued from FIG. 14.

Next, the back surface of the semiconductor substrate SUB is ground as shown in FIG. 15. More specifically, for example, the back surface of the semiconductor substrate SUB is ground such that the thickness of the semiconductor substrate SUB becomes substantially 100 µm to 200 µm.

4. Forming Process of Back Surface Electrode

Figure 16:
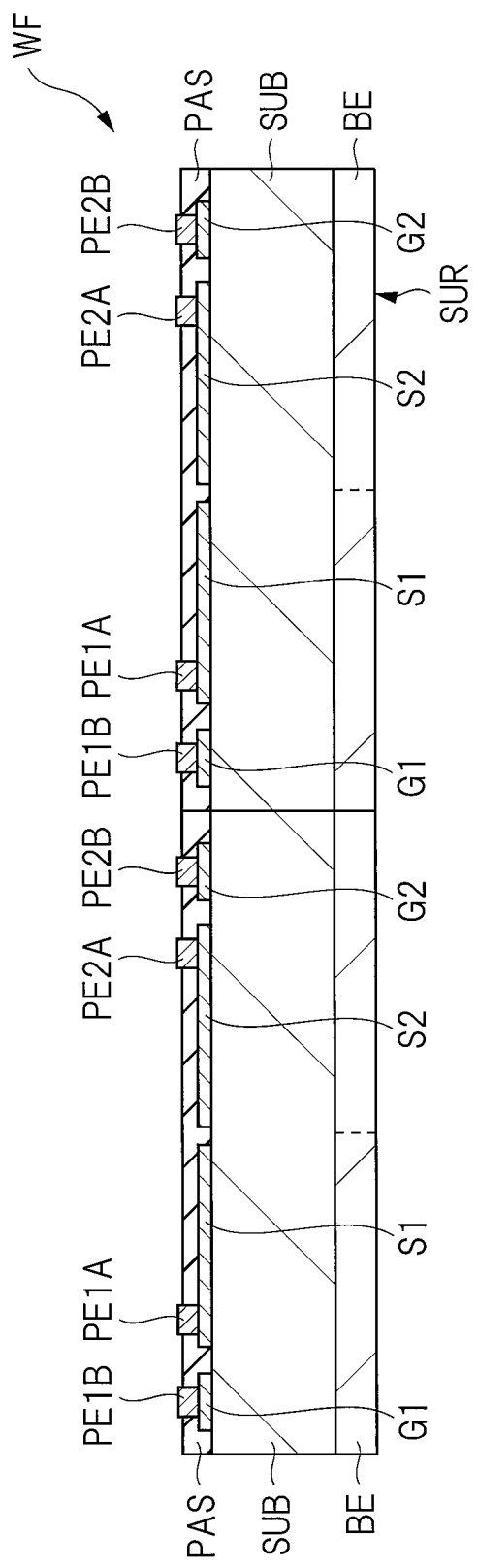
FIG. 16 is a cross-sectional view showing the manufacturing step of the semiconductor chip continued from FIG. 15.

Then, as shown in FIG. 16, the back surface electrode BE is formed on the back surface of the semiconductor substrate SUB. This back surface electrode BE is formed of, for example, a layered film including a titanium film, a nickel film, and a silver film, or a layered film including a titanium film and a copper film, and can be formed by sputtering or plating, for example. In particular, the material constituting the back surface electrode BE is not limited thereto. Considering that the wiring formed in the wiring substrate is formed of the copper film in consideration of improvement of the adhesion to the wiring substrate, it is desirable to form the back surface electrode BE with a copper film from the viewpoint of improving the adhesion between the back surface electrode BE and the wiring substrate when buried in the wiring substrate.

Also, the back surface electrode BE functions as the common drain electrode for the discharge power transistor and the charge power transistor reversely connected in series with each other. Therefore, in order to reduce the ON resistance, the back surface electrode BE is formed thicker than the thickness of the source electrode S1 and the source electrode S2 formed on the front surface of the semiconductor substrate SUB. Accordingly, resistance of the back surface electrode BE can be reduced. As a result, it is possible to reduce ON resistance generated when the charge and discharge currents flow between the discharge power transistor and the charge power transistor reversely connected in series with each other.

5. Forming Process of Uneven Shape

Figure 17:
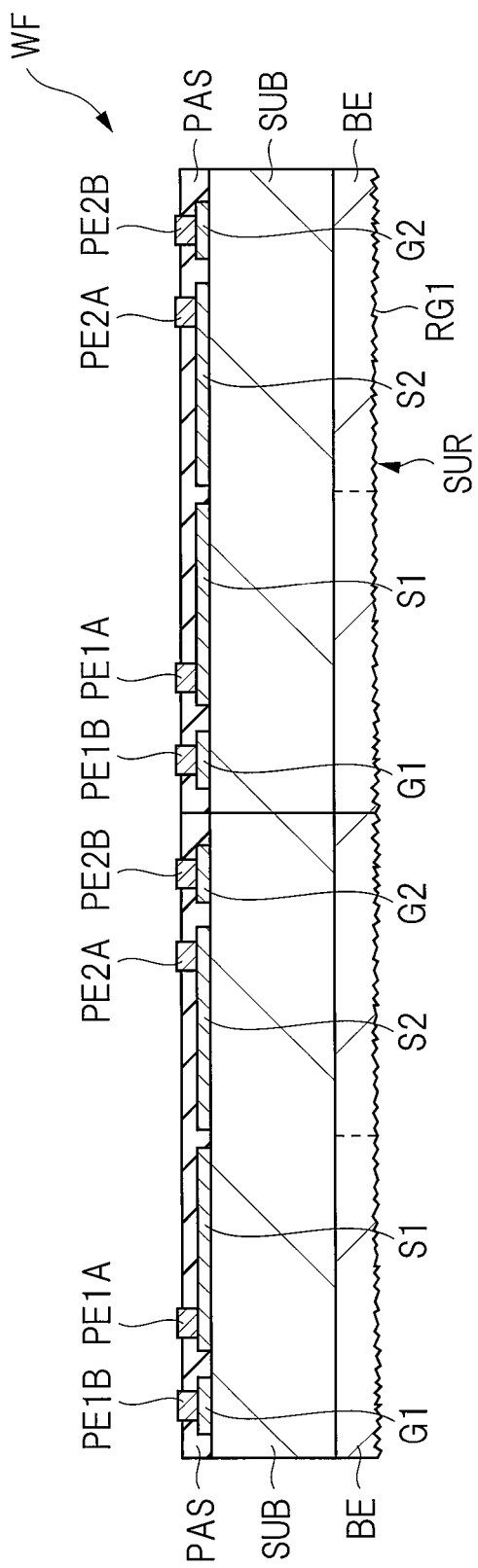
FIG. 17 is a cross-sectional view showing the manufacturing step of the semiconductor chip continued from FIG. 16.

Subsequently, as shown in FIG. 17, the uneven shape RG1 is formed on the exposed surface (lower surface) SUR of the back surface electrode BE. For example, the exposed surface SUR of the back surface electrode BE is subjected to wet etching using a chemical solution, so that the uneven shape RG1 can be formed. More specifically, using a spin processor that is widely used for wafer etching, a chemical solution that roughens the exposed surface SUR of the back surface electrode BE is sprayed, so that the uneven shape RG1 can be formed quickly and easily on the exposed surface SUR of the back surface electrode BE. A chemical solution that roughens the copper film constituting the back surface electrode BE is often used for wiring formed in the wiring substrate, and it is possible to easily select chemical solutions of various specifications. Therefore, it is possible to find a chemical solution and processing conditions that can form a large difference between the top and the bottom of the projection on the exposed surface SUR without much reducing the thickness of the entire back surface electrode BE. For example, by roughening a copper film having an original film thickness of about 10 μm, an uneven shape having the difference between the top and the bottom of the projection of about 3 μm or more on the exposed surface SUR can be formed without greatly reducing the original film thickness. Note that the method of roughening the exposed surface SUR of the back surface electrode BE is not limited to the spin etching, but there are various methods, and accordingly, methods other than spin etching can also be used.

6. Singulation Process

Thereafter, the semiconductor wafer WF is cut into a plurality of semiconductor chips CHP1 by dicing. For example, by dicing at a portion between the chip forming region CR1 and the chip forming region CR2 shown in FIG. 17, the chip forming region CR1 and the chip forming region CR2 are cut apart, and as a result, a semiconductor chip including the separated chip forming region CR1 and a semiconductor chip including the separated chip forming region CR2 are obtained. After that, the singulated semiconductor chip CHP1 goes through necessary inspections such as an electrical characteristic inspection and a visual inspection, and then, the singulated semiconductor chip CHP1 is packed by a tape storage, a tray storage, or the like to be shipped out.

<Manufacturing Method of Semiconductor Device>

Next, a manufacturing method of a semiconductor device according to this first embodiment will be described. Note that the manufacturing method of a semiconductor device according to this first embodiment includes various manufacturing methods, and the manufacturing method of the semiconductor device indicated below is one example and is not limited thereto.

1. Preparation Process of Wiring Substrate and Electronic Components

Figure 18:
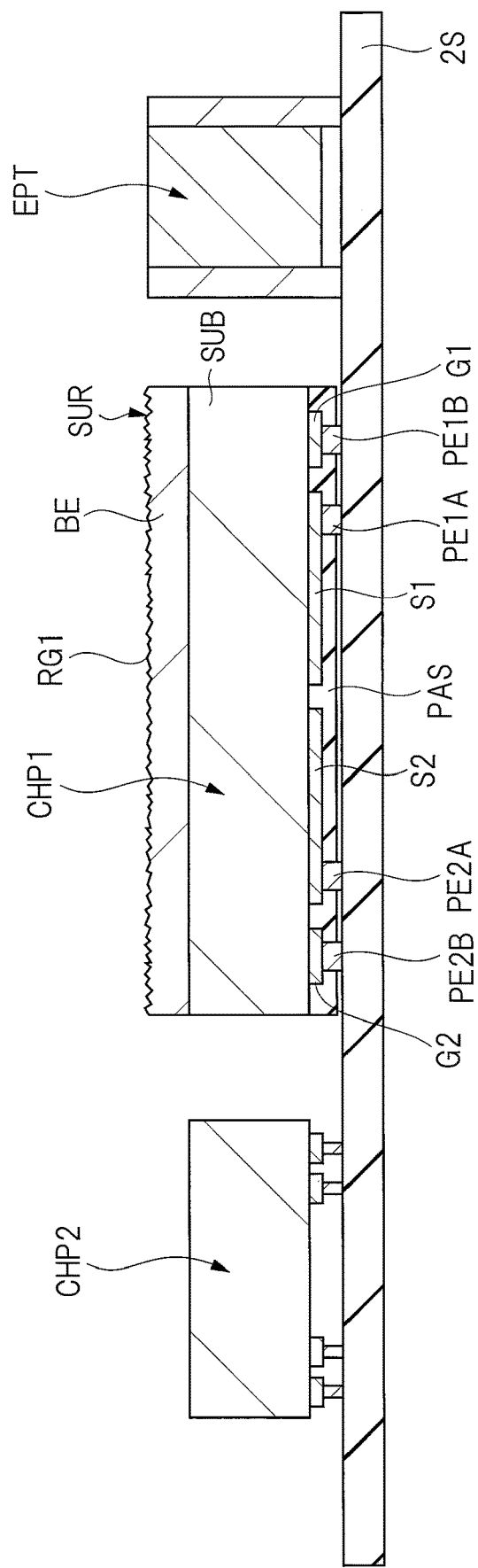
FIG. 18 is a cross-sectional view showing a manufacturing step of the semiconductor device according to the first embodiment.

First, as shown in FIG. 18, a substrate 2S is prepared, and a plurality of electronic components are prepared. More specifically, the plurality of electronic components include a semiconductor chip CHP1 functioning as a bidirectional connection unit through which charge and discharge currents flow, a semiconductor chip CHP2 functioning as a control unit controlling charge/discharge of a secondary battery, and an electronic component EPT formed of a passive component such as a capacitor or a resistive element.

2. Component Mounting Process

Next, as shown in FIG. 18, the semiconductor chip CHP1, the semiconductor chip CHP2, and the electronic component EPT are mounted over the substrate 2S. That is, a plurality of terminals are formed in a front surface of the substrate 2S, and the semiconductor chip CHP1, the semiconductor chip CHP2, and the electronic component EPT are mounted over the substrate 2S such that the plurality of terminals are electrically connected with the semiconductor chip CHP1, the semiconductor chip CHP2, and the electronic component EPT. For example, when the semiconductor chip CHP1 is focused, the semiconductor chip CHP1 is mounted over the substrate 2S in a state in which the front surface of the semiconductor chip CHP1 faces downward such that columnar electrodes PE1A to PE2B formed in the semiconductor chip CHP1 and the terminals formed in the substrate 2S are connected to each other. Therefore, a back surface of the semiconductor chip CHP1 on which a back surface electrode BE is formed will face upward.

3. Sealing Process

Figure 19:
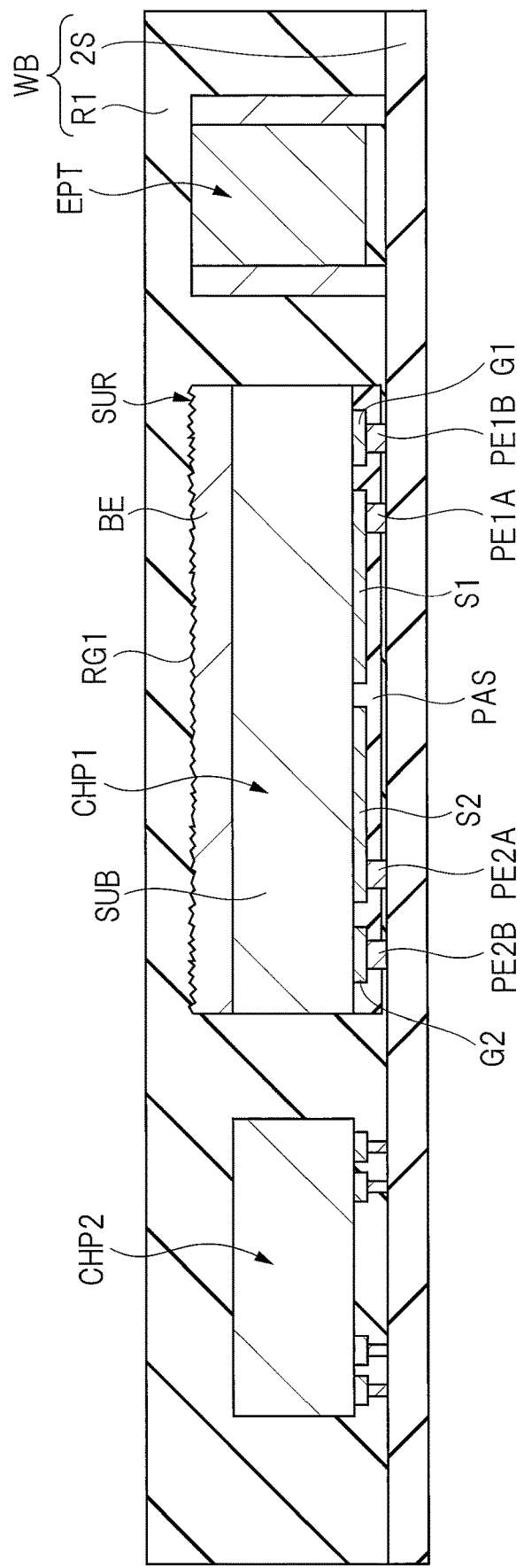
FIG. 19 is a cross-sectional view showing the manufacturing step of the semiconductor device continued from FIG. 18.

Subsequently, as shown in FIG. 19, the semiconductor chip CHP1, the semiconductor chip CHP2, and the electronic component EPT mounted over the substrate 2S are covered (sealed) with an insulating resin sealing member R1. Note that the resin sealing member R1 used in this first embodiment is made of an epoxy resin material, for example. Accordingly, the semiconductor chip CHKP2 and the electronic component EPT are embedded in the wiring substrate WB made of the substrate 2S and the resin sealing member R1. As a result, as shown in FIG. 19, the back surface electrode BE formed on the back surface of the semiconductor chip CHP1 comes into contact with the resin sealing member R1. At this time, according to this first embodiment, since the uneven shape RG1 is formed on the back surface electrode BE, the adhesion between the back surface electrode BE and the resin sealing member R1 due to the anchor effect caused by the uneven shape RG1 can be improved.

4. Via Forming Process

Figure 20:
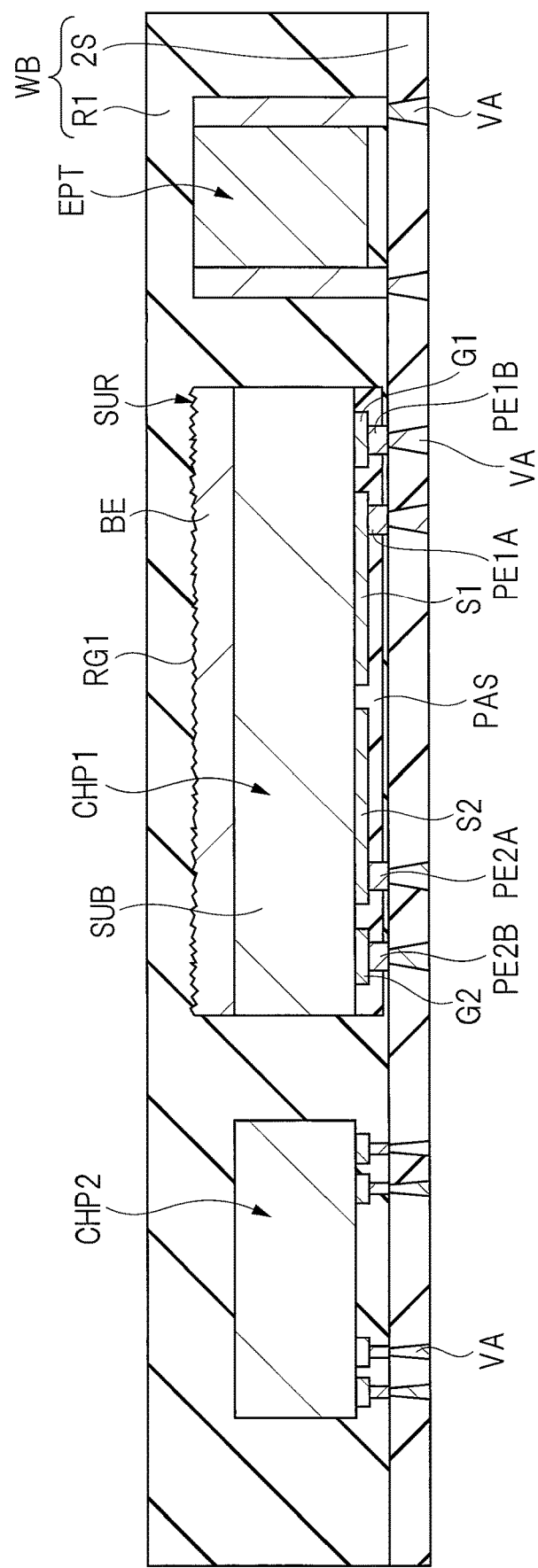
FIG. 20 is a cross-sectional view showing the manufacturing step of the semiconductor device continued from FIG. 19.

Next, as shown in FIG. 20, holes are formed in the substrate 2S, for example, by using a laser. Thereafter, for example, by using a plating method, a copper film is embedded in this hole to form a via VA.

5. Wiring Forming Process

Figure 21:
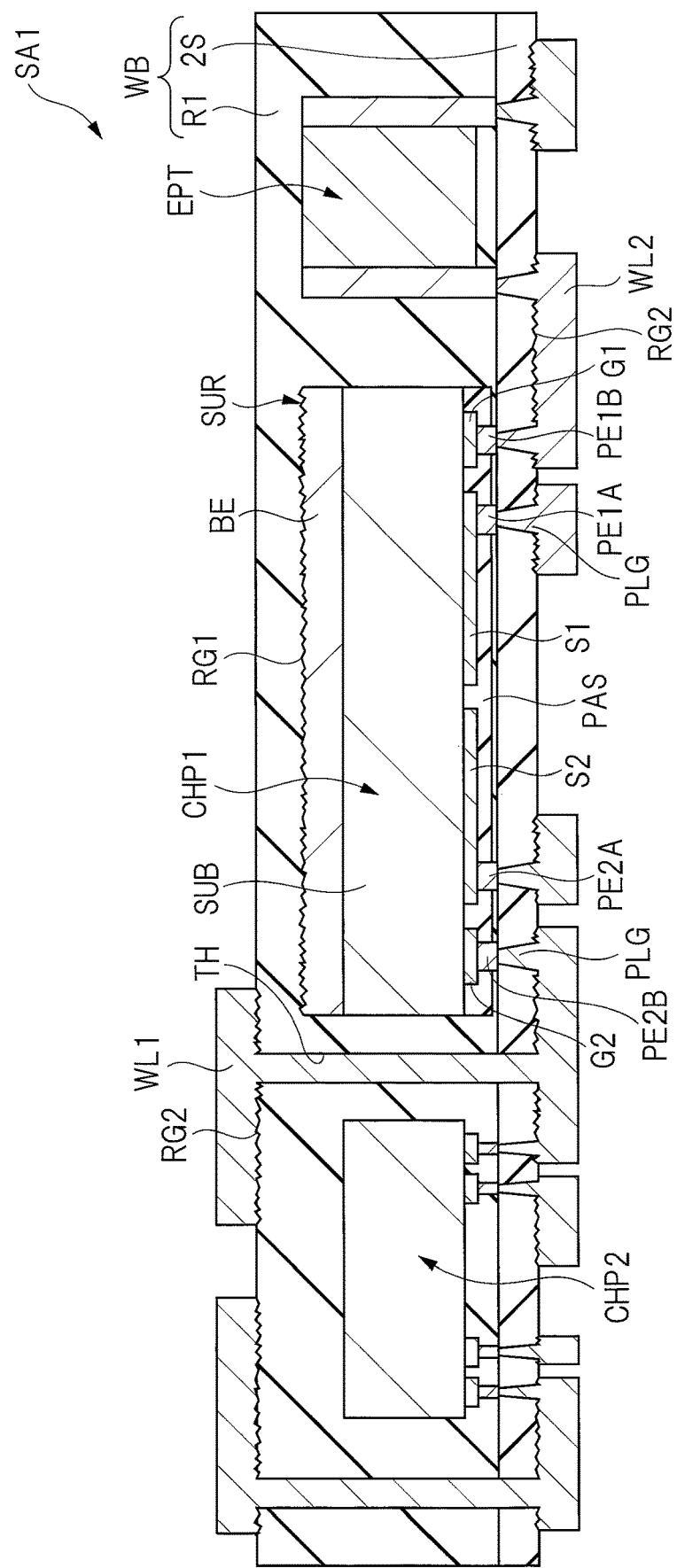
FIG. 21 is a cross-sectional view showing the manufacturing step of the semiconductor device continued from FIG. 20.

Subsequently, as shown in FIG. 21, through holes TH penetrating through the wiring substrate WB including the substrate 2S and the resin sealing member R1 are formed, a wiring WL1 made of a copper film is formed on an upper surface of the wiring substrate WB, and a wiring WL2 made of a copper film is formed on a lower surface of the wiring substrate WB. As a result, the electronic component (the semiconductor chip CHP1, the semiconductor chip CHP2, the electronic component EPT) embedded in the wiring substrate WB are electrically connected with the wiring WL1 and the wiring WL2 formed on the wiring substrate WB via the via VA. In this manner, the semiconductor device SA1 according to this first embodiment can be manufactured.

<Manufacturing Method of Battery Pack>

Next, a manufacturing method of a battery pack (electronic device) according to this first embodiment will be described. First, a chargeable and dischargeable secondary battery (for example, a lithium ion battery) is prepared, and a semiconductor device SA1 according to this first embodiment which controls this secondary battery is prepared. Then, by electrically connecting the secondary battery and the semiconductor device SA1, a battery pack according to this first embodiment can be manufactured.

Second Embodiment

In the second embodiment, an example will be described in which the technical idea according to the first embodiment is applied to a package structural body in which a semiconductor chip having a back surface electrode is mounted on a chip mounting portion and the semiconductor chip is covered with a sealing body.

<Findings Newly Found by Inventor of Present Application>

First, the findings newly found by the inventor of the present application will be described. For example, a discharge power transistor and a charge power transistor are formed in a semiconductor chip in which a bidirectional connection unit is formed. Here, each of the discharge power transistor and the charge power transistor includes several thousands to hundreds of thousands of unit transistors connected in parallel with each other. At this time, a magnitude of the charge and discharge currents flowing through the discharge power transistor and the charge power transistor is increased in accordance with increase in the charge capacity of the secondary battery. In this case, when increase of the allowable current of the discharge power transistor and the charge power transistor and reduction of the ON resistance are considered, it is necessary to increase the number of unit transistors constituting each of the discharge power transistor and the charge power transistor. This means that the external size of the semiconductor chip becomes large, and as a result, the size of the semiconductor device becomes large. In particular, a size of the chip mounting portion having a semiconductor chip in which a power transistor is formed mounted thereon is usually larger than the size of the semiconductor chip in view of flowing a large current and improving heat dissipation efficiency (large tab structure). However, in this case, if the size of the semiconductor chip is increased, it is necessary to further increase the size of the chip mounting portion so as to have the larger semiconductor chip disposed inside the chip mounting portion in a plan view. In other words, it is necessary to increase the size of the chip mounting portion such that the back surface of the semiconductor chip is not exposed from the chip mounting portion. That is, in this structure (large tab structure), the size of the chip mounting portion must also be increased according to increase in the size of the semiconductor chip, resulting in significant increase in the size of the semiconductor device SA1.

Figure 22:
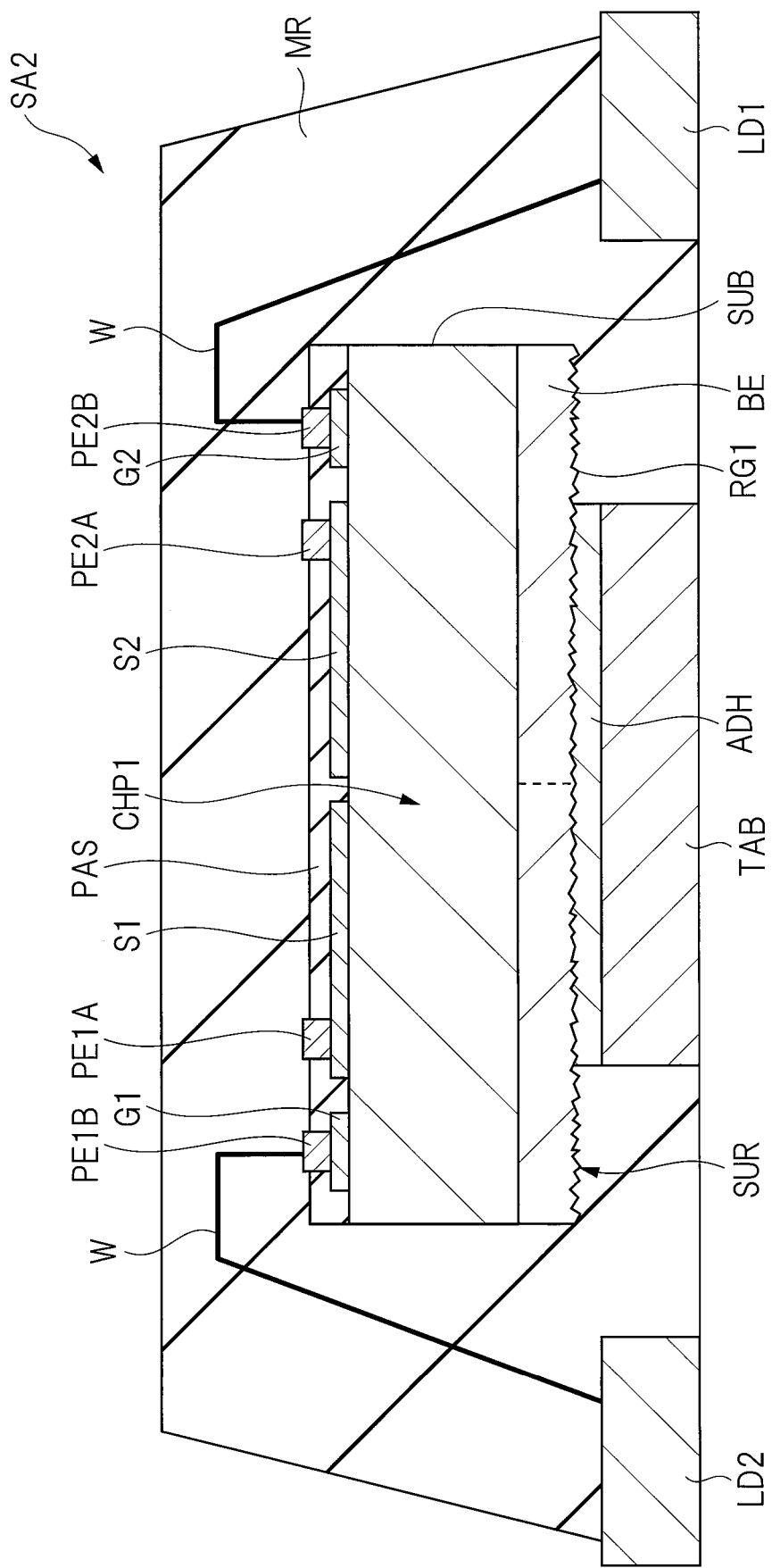
FIG. 22 is a cross-sectional view showing a manufacturing step of a semiconductor device according to a second embodiment.

Therefore, the second embodiment adopts a configuration in which, in consideration of increase of the allowable current and reduction of the ON resistance, the external size of the semiconductor chip is increased and the external size of the chip mounting portion is maintained as it is. In this configuration, even if the external size of the semiconductor chip becomes large, since the external size of the chip mounting portion is maintained as it is, increase in the size of the semiconductor device can be kept to the minimum. However, in the case of this configuration, the external size of the semiconductor chip is increased, while the external size of the chip mounting portion is maintained as it is. Therefore, as shown in FIG. 22, the external size of the semiconductor chip inevitably becomes larger than the external size of the chip mounting portion. As a result, the semiconductor chip has a portion (protruding portion) protruding from the chip mounting portion. The inventor of the present application found that new matters to be improved arise due to the presence of the portion protruding from the chip mounting portion. That is, the portion protruding from the chip mounting portion comes into contact with the sealing body. That is, in the portion of the semiconductor chip protruding from the chip mounting portion, the back surface electrode formed in the semiconductor chip is in contact with the sealing body. At this time, the adhesion between the back surface electrode and the sealing body is not good. Therefore, in the portion protruding from the chip mounting portion, peeling tends to occur between the back surface electrode and the sealing body, and as a result, it is concerned that reliability of the semiconductor device may be reduced.

Therefore, also in this second embodiment, the technical idea according to the first embodiment is applied. This point will be described below.

<Configuration of Semiconductor Device According to Second Embodiment>

FIG. 22 is a cross-sectional view showing a configuration of a semiconductor device SA2 according to a second embodiment. As shown in FIG. 22, the semiconductor device SA2 according to this second embodiment includes a chip mounting portion (component mounting portion) TAB and a lead LD1 and a lead LD2 arranged outside the chip mounting portion TAB. A semiconductor chip CHP1 having a bidirectional connection unit formed therein is mounted over the chip mounting portion TAB via an adhesive ADH.

At this time, in a plan view, the chip mounting portion TAB is disposed inside the semiconductor chip CHP1 (small tab structure). That is, as shown in FIG. 22, the external size of the semiconductor chip CHP1 is larger than the external size of the chip mounting portion TAB, and the semiconductor chip CHP1 has a portion protruding from an outer edge portion of the chip mounting portion TAB.

Also, a back surface electrode BE is formed on a back surface of the semiconductor chip CHP1, and an uneven shape RG1 is formed on an exposed surface (lower surface) SUR of the back surface electrode BE. Therefore, the uneven shape RG1 formed on the back surface electrode BE comes in contact with the adhesive ADH.

Meanwhile, the source electrodes S1 and S2 and the gate electrodes G1 and G2 are formed on a front surface of the semiconductor chip CHP1. A columnar electrode PE1A is formed on the source electrode S1, and a columnar electrode PE1B is formed on the gate electrode G1. Likewise, a columnar electrode PE2A is formed on the source electrode S2, and a columnar electrode PE2B is formed on the gate electrode G2. At this time, the columnar electrode PE1B and the lead LD2 are electrically connected by a wire W, and the columnar electrode PE2B and the lead LD1 are electrically connected by a wire W. A sealing body MR made of, for example, a silica-based filler and a thermosetting epoxy resin is formed so as to cover the semiconductor chip CHP1 and the wire W. Particularly, in the semiconductor device SA2 according to this second embodiment, a portion protruding from the chip mounting portion TAB is formed in the semiconductor chip CHP1. Therefore, in this protruding portion, the uneven shape RG1 formed on the back surface electrode BE comes into contact with the sealing body MR. In this manner, the semiconductor device SA2 according to this second embodiment is configured.

Feature of Second Embodiment

A feature point according to the second embodiment is in that, for example, as shown in FIG. 22, an uneven shape RG1 is intentionally formed on the entire lower surface of the back surface electrode BE. Thus, according to this second embodiment, the adhesion between the back surface electrode BE and the sealing body MR can be improved by the anchor effect due to the uneven shape RG1 formed on the back surface electrode BE, in the portion protruding from the outer edge portion of the chip mounting portion TAB. This means that peeling of the semiconductor chip CHP1 from the sealing body MR is effectively suppressed by improving the adhesion between the back surface electrode BE and the sealing body MR, whereby reliability of the semiconductor device SA2 can be improved. Thus, by applying the technical idea described in the first embodiment also to the semiconductor device SA2 in this second embodiment, reliability of the semiconductor device SA2 can be improved.

<First Modification>

Next, the first modification of the second embodiment will be hereinafter described. That is, in the second embodiment, a description has been given regarding an example in which the technical idea according to the first embodiment is applied to the semiconductor chip CHP1 in which a discharge power transistor and a charge power transistor constituting a bidirectional connection unit are formed. However, the embodiment is not limited thereto, but the technical idea in the first embodiment can be applied to a semiconductor chip in which one power transistor is formed.

In this case, it is particularly useful in the following points. That is, in a semiconductor chip in which one power transistor is formed, for example, current flows between the semiconductor chip and the chip mounting portion. At this time, when a portion protruding from the chip mounting portion is present in the semiconductor chip, a current path which bypasses the portion protruding from the chip mounting portion becomes longer. As a result, resistance of this current path increases. From this fact, even if the external size of the semiconductor chip is increased to increase the allowable current, the portion protruding from the chip mounting portion substantially hardly contributes as the current path. Therefore, it is effective to increase a film thickness of the back surface electrode formed in the semiconductor chip in order to allow the portion protruding from the chip mounting portion to contribute as a substantial current path. This is because, by increasing the film thickness of the back surface electrode, it is possible to reduce a resistance value of the current path that bypasses the portion protruding from the chip mounting portion, so that current flows also in the portion protruding from the chip mounting portion, and the unit transistor formed in the protruding portion can be effectively utilized. In particular, the film thickness of the back surface electrode is formed larger than a film thickness of the source electrode formed on a front surface of the semiconductor chip. This makes it possible to reduce the resistance value of the current path that bypasses the portion protruding from the chip mounting portion. However, in this configuration, the film thickness of the back surface electrode is particularly large. As a result, decrease in adhesion between the portion protruding from the chip mounting portion and a sealing body tends to become apparent. Therefore, also in this modification, it is effective to intentionally form an uneven shape RG1 on the entire lower surface of back surface electrode BE as in the second embodiment. As a result, even in this modification, in the portion protruding from an outer edge portion of a chip mounting portion TAB, due to an anchor effect caused by the uneven shape RG1 formed in the back surface electrode BE, adhesion between the back surface electrode BE and a sealing body MR can be improved. In this manner, like the first modification, the same technical idea as in the second embodiment is applied to the semiconductor chip in which one power transistor is formed, so that the portion protruding from the chip mounting portion can also be effectively utilized as a current path having a low resistance value. Furthermore, it is possible to improve the adhesion between the portion protruding from the chip mounting portion and the sealing body. That is, according to this first modification, it is possible to obtain such a remarkable effect that performance improvement can be achieved by increasing the allowable current in the semiconductor device and by reducing the ON resistance and that it is possible to improve reliability of the semiconductor device by improving the adhesion between the portion protruding from the chip mounting portion and the sealing body.

<Second Modification>

In the first modification, a description has been given assuming that the first modification is applied to the power MOSFET as an example of one power transistor. However, the technical idea according to the second embodiment is not limited to the power MOSFET, but may also be widely applied to, for example, a semiconductor device having a semiconductor chip in which one insulated gate bipolar transistor (IGBT) is formed.

For example, when the technical idea of the second embodiment is applied to the IGBT, the following configuration is realized. That is, the semiconductor chip includes: a semiconductor substrate in which an insulated gate bipolar transistor is formed; and a first front surface electrode (emitter electrode, emitter pad) formed on a first surface of the semiconductor substrate and electrically connected to the insulated gate bipolar transistor. Further, the semiconductor chip includes: a second front surface electrode (gate electrode, gate pad) formed on the first surface of the semiconductor substrate and electrically connected to the insulated gate bipolar transistor; and a back surface electrode (collector electrode) formed on a second surface opposite to the first surface of the semiconductor substrate and electrically connected to the insulated gate bipolar transistor. At this time, an uneven shape is formed on an exposed surface of the back surface electrode.

<Third Modification>

In the first modification, a description has been given assuming that the first modification is applied to the power MOSFET. However, the technical idea according to the second embodiment is not limited to the power MOSFET, but may also be widely applied to, for example, a semiconductor device having a semiconductor chip in which one diode is formed.

For example, when the technical idea according to the second embodiment is applied to the diode, the following configuration is realized. That is, the semiconductor chip includes a semiconductor substrate having a diode formed therein; a first front surface electrode (anode electrode, anode pad) formed on a first surface of the semiconductor substrate and electrically connected to the diode; and a back surface electrode (cathode electrode) formed on a second surface opposite to the first surface of the semiconductor substrate and electrically connected to the diode. At this time, an uneven shape is formed on the exposed surface of the back surface electrode.

Third Embodiment

In this third embodiment, a description will be given regarding an example in which the technical idea according to the first embodiment is applied to a semiconductor device in which a semiconductor chip having a back surface electrode is embedded in a substrate, and a source pad, a gate pad, and a drain pad are formed on the same surface of the substrate.

FIG. 23(a) is a plan view seen from a lower surface of a semiconductor device SA3 according to the third embodiment. As shown in FIG. 23(a), the semiconductor device SA3 according to the third embodiment includes, for example, a rectangular substrate WB. A source pad SP, a gate pad GP, and a drain pad DP are formed on the same surface of the substrate WB.

FIG. 23(b) is a cross-sectional view taken along a line A-A of FIG. 23(a). As shown in FIG. 23(b), the semiconductor chip CHP1 is embedded in the substrate WB. At this time, a source electrode SE and a gate electrode GE are formed on a front surface (on the lower surface side in FIG. 23) of the semiconductor chip CHP1, and on aback surface (upper surface side in FIG. 23) of the semiconductor chip CHP1, a back surface electrode BE is formed. As shown in FIG. 23(b), on the front surface side of the semiconductor chip CHP1, a columnar electrode PLR1 electrically connected to the source electrode SE is formed, and a columnar electrode PLR2 electrically connected to the gate electrode GE is formed. At this time, the columnar electrode PLR1 is electrically connected to the source pad SP formed on the lower surface of the substrate WB via a plug PLG1 formed on the substrate WB. Likewise, the columnar electrode PLR2 is electrically connected to the gate pad GP formed on the lower surface of the substrate WB via a plug PLG2 formed in the substrate WB. Meanwhile, the back surface electrode BE formed on the back surface of the semiconductor chip CHP1 is electrically connected to a drain wiring DL formed on the upper surface of the substrate WB via a plug PLG3 formed on the upper surface side of the substrate WB. The drain wiring DL is electrically connected to the drain pad DP formed on the lower surface of the substrate WB via a plug PLG4 penetrating the substrate WB.

Therefore, according to the semiconductor device SA3 of the third embodiment, for example, the semiconductor device SA3 is mounted such that the lower surface of the semiconductor device SA3 faces amounting board, so that each of the source pad SP, the gate pad GP, and the drain pad DP is electrically connected to a terminal formed in the mounting board. That is, according to the semiconductor device SA3 of the third embodiment, the back surface electrode BE is formed on the back surface of the semiconductor chip CHP1 in accordance with the configuration in which the power transistor flowing current in the thickness direction of the semiconductor chip CHP1 is formed. In this third embodiment, the semiconductor chip CHP1 is embedded in the substrate WB, and the back surface electrode BE is electrically connected to the drain pad DP formed on the lower surface of the substrate WB via the plug PLG3, the drain wiring DL, and the plug PLG4 formed in the substrate WB. Thus, according to the third embodiment, even in the semiconductor chip CHHP1 in which the back surface electrode is formed on the surface opposite to the surface on which the source electrode SE and the gate electrode GE are formed, the semiconductor chip CHP1 is embedded in the substrate WB, and the back surface electrode BE is electrically connected to the drain pad DP formed on the lower surface of the substrate WB via the plug PLG3, the drain wiring DL, and the plug PLG4 formed in the substrate WB. Thus, the source pad SP, the gate pad GP, and the drain pad DP can be formed on the same surface (lower surface) of the substrate WB. As a result, according to the semiconductor device SA3 in the third embodiment, in mounting on the mounting board, since the source pad SP, the gate pad GP, and the drain pad DP are formed on the same surface of the semiconductor device SA3, such an advantage that each of the source pad SP, the gate pad GP, and the drain pad DP can be easily connected to the terminal of the mounting substrate can be obtained.

Here, also in the semiconductor device SA3 according to the third embodiment, as shown in FIG. 23(b), an uneven shape RG1 is intentionally formed on an exposed surface SUR of the back surface electrode BE. As a result, also in the third embodiment, the anchor effect due to the uneven shape RG1 formed on the back surface electrode BE makes it possible to improve the adhesion between the back surface electrode BE and the substrate WB in which the semiconductor chip CHP1 is embedded. This means that, by improving the adhesion between the back surface electrode BE and the substrate WB, peeling of the semiconductor chip CHP1 from the substrate WB is effectively suppressed. Thereby, reliability of the semiconductor device SA3 can be improved. Thus, by applying the technical idea described in the first embodiment also to the semiconductor device SA3 according to the third embodiment, the reliability of the semiconductor device SA3 can be improved.

Note that, in this third embodiment, a description has been given assuming that the power MOSFET is formed in the semiconductor chip CHP1, but the present invention is not limited thereto. Even in the case where the IGBT is formed in the semiconductor chip CHP1, the configuration of the semiconductor device SA3 according to this third embodiment can be applied. In this case, the source pad SP becomes an emitter pad, and the drain pad DP becomes a collector pad.

In the foregoing, the invention made by the inventor of the present invention has been concretely described based on the embodiments. However, it is needless to say that the present invention is not limited to the foregoing embodiments and various modifications and alterations can be made within the scope of the present invention.

Some of the contents described in the embodiments will be described below.

(Supplementary Note 1)

A manufacturing method for a semiconductor chip, the method including the following steps of:

(a) preparing a semiconductor wafer in which a first power transistor is formed and a first front surface electrode and a second front surface electrode electrically connected to the first power transistor are formed on a first surface;

(b) forming, on a second surface on a side opposite to the first surface of the semiconductor wafer, a back surface electrode electrically connected to the first power transistor;

(c) forming an uneven shape on a front surface of the back surface electrode; and (d) singulating the semiconductor wafer to obtain a plurality of semiconductor chips.

(Supplementary Note 2)

The manufacturing method for a semiconductor chip according to Supplementary Note 1, in which the step (c) uses wet etching.

(Supplementary Note 3)

A manufacturing method for a semiconductor device including the following steps of:

(a) preparing a first semiconductor component;

(b) mounting the first semiconductor component on a base material; and (c) sealing the first semiconductor component with a sealing member;

in which the first semiconductor component prepared in the step (a) includes:

a semiconductor substrate in which a first power transistor is formed;

a first front surface electrode formed on a first surface of the semiconductor substrate and electrically connected to the first power transistor;

a second front surface electrode formed on the first surface of the semiconductor substrate and electrically connected to the first power transistor; and
a back surface electrode formed on a second surface on a side opposite to the first surface of the semiconductor substrate and electrically connected to the first power transistor, and
in which an uneven shape is formed on a front surface of the back surface electrode.

(Supplementary Note 4)

A manufacturing method for an electronic device, the method including the following steps of:

(a) preparing a secondary battery capable of being charged and discharged;

(b) preparing a semiconductor device controlling the secondary battery; and (c) electrically connecting the secondary battery and the semiconductor device, in which the semiconductor device prepared in the step (b) includes:
a control unit controlling charge and discharge of the secondary battery; and
a bidirectional connection unit electrically connected to the control unit and through which charge and discharge currents flow,
in which the semiconductor device includes:
a wiring substrate;
a control chip embedded in the wiring substrate and in which the control unit is formed; and
a semiconductor chip embedded in the wiring substrate and in which the bidirectional connection unit is formed,
in which the semiconductor chip is formed with:
a semiconductor substrate in which a first power transistor and a second power transistor reversely connected in series with the first power transistor are formed;
a first source electrode formed on a first surface of the semiconductor substrate and electrically connected to a first source of the first power transistor;
a second source electrode formed on the first surface of the semiconductor substrate and electrically connected to a second source of the second power transistor;
a first gate electrode formed on the first surface of the semiconductor substrate and electrically connected to a first gate of the first power transistor;
a second gate electrode formed on the first surface of the semiconductor substrate and electrically connected to a second gate of the second power transistor; and
a back surface electrode formed on a second surface on a side opposite to the first surface of the semiconductor substrate and electrically connected to a drain of the first power transistor and a drain of the second power transistor, and
in which an uneven shape is formed on a front surface of the back surface electrode in contact with the wiring substrate.

(Supplementary Note 5)

A semiconductor chip including:
a semiconductor substrate in which a diode is formed;
a first front surface electrode formed on a first surface of the semiconductor substrate and electrically connected to the diode; and
a back surface electrode formed on a second surface on a side opposite to the first surface of the semiconductor substrate and electrically connected to the diode,
in which an uneven shape is formed on a front surface of the back surface electrode.

EXPLANATION OF REFERENCE CHARACTERS

BE Back surface electrode
BPAC Battery pack (electronic device)
CHP1 Semiconductor chip (semiconductor component, electronic component)
CHP2 Semiconductor chip (semiconductor component, electronic component, control chip)
CU Control unit
EPT Electronic component
G1 Gate electrode (second front surface electrode)
G2 Gate electrode (fourth front surface electrode)
IRU Bidirectional connection unit
LIB Lithium ion battery (secondary battery)
MR Sealing body (sealing member)
PE1A Columnar electrode
PE1B Columnar electrode
PE2A Columnar electrode
PE2B Columnar electrode
Q1 Discharge power transistor (power transistor)
Q2 Charge power transistor (power transistor)
RG1 Uneven shape
RG2 Uneven shape
R1 Resin sealing member (sealing member)
SA1 Semiconductor device
SA2 Semiconductor device
SUB Semiconductor substrate
S1 Source electrode (first front surface electrode)
S2 Source electrode (third front surface electrode)
TAB Chip mounting portion (component mounting portion)
WB Wiring substrate
WL1 Wiring
WL2 Wiring

The invention claimed is:

1. A semiconductor chip comprising:
a semiconductor substrate in which a first power transistor is formed;
a first front surface electrode formed on a first surface of the semiconductor substrate and electrically connected to the first power transistor;
a second front surface electrode formed on the first surface of the semiconductor substrate and electrically connected to the first power transistor; and
a back surface electrode formed on a second surface on a side opposite to the first surface of the semiconductor substrate and electrically connected to the first power transistor,
wherein an uneven shape formed on a front surface or the back surface electrode, and
wherein a surface roughness of the front surface of the back surface electrode on which the uneven shape is formed is rougher than a surface roughness of a front surface of the first front surface electrode.

2. The semiconductor chip according to claim 1, wherein a thickness of the back surface electrode is larger than a thickness of each of the first front surface electrode and the second front surface electrode.

3. The semiconductor chip according to claim 2, wherein an external size of the back surface electrode is equal to or less than an external size of the semiconductor substrate.

4. The semiconductor chip according to claim 1, wherein the first power transistor is a first power MOSFET, wherein the first front surface electrode is electrically connected to a first source of the first power MOSFET,
wherein the second front surface electrode is electrically connected to a first gate of the first power MOSFET, and
wherein the back surface electrode is electrically connected to a first drain of the first power MOSFET.

5. The semiconductor chip according to claim 4,
wherein the semiconductor chip includes:
the semiconductor substrate in which a second power MOSFET reversely connected in series with the first power MOSFET is formed;
a third front surface electrode formed on the first surface of the semiconductor substrate and electrically connected to a second source of the second power MOSFET;
a fourth front surface electrode formed on the first surface of the semiconductor substrate and electrically connected to a second gate of the second power MOSFET; and
the back surface electrode electrically connected to a drain of the second power MOSFET.

6. The semiconductor chip according to claim 5,
wherein a thickness of the back surface electrode is larger than a thickness of each of the first front surface electrode, the second front surface electrode, the third front surface electrode, and the fourth front surface electrode.

7. The semiconductor chip according to claim 6,
wherein an external size of the back surface electrode is equal to or less than an external size of the semiconductor substrate.

8. A semiconductor device comprising:
a first semiconductor component; and
a sealing member sealing the first semiconductor component,
wherein the first semiconductor component includes:
a semiconductor substrate in which a first power transistor is formed;
a first front surface electrode formed on a first surface of the semiconductor substrate and electrically connected to the first over transistor;
a second front surface electrode formed on the first surface of the semiconductor substrate and electrically connected to the first power transistor; and
a back surface electrode formed on a second surface on a side or to the first surface of the semiconductor substrate and electrically connected to the first power transistor,
wherein a first uneven shape is formed on a front surface of the back surface electrode in contact with the sealing member,
wherein the semiconductor device includes a wiring substrate,
wherein the wiring substrate includes:
a substrate;
the first semiconductor component mounted on the substrate;
the sealing member sealing the first semiconductor component; and
a wiring electrically connected with the first semiconductor component, and
wherein a surface roughness of the surface, which is in contact with the sealing member, of the back surface electrode in which the first uneven shape is formed is rougher than a surface roughness of a front surface of the wiring formed on the wiring substrate.

9. The semiconductor device according to claim 8,
wherein the wiring of the wiring substrate has a second uneven shape formed thereon, and
wherein a surface roughness of a surface, which is in contact with the wiring substrate, of the back surface electrode on which the first uneven shape is formed is equivalent to a surface roughness of a front surface of the wiring on which the second uneven shape is formed.

10. The semiconductor device according to claim 8,
wherein a thickness of the back surface electrode is equal to a thickness of the wiring.

11. The semiconductor device according to claim 8,
wherein the back surface electrode is made of the same material as a material of the wiring.

12. The semiconductor device according to claim 8,
wherein the wiring substrate includes an electronic component mounted on the substrate and electrically connected with the first semiconductor component, and
wherein the electronic component is sealed with the sealing member.

13. The semiconductor device according to claim 8,
wherein the semiconductor device includes:
a component mounting portion mounting the first semiconductor component; and
the sealing member sealing the first semiconductor component, and
wherein, in a plan view, the component mounting portion is disposed inside the first semiconductor component.

14. The semiconductor device according to claim 8,
wherein an external size of the back surface electrode is equal to or less than an external size of the semiconductor substrate.

15. An electronic device comprising:
a secondary battery capable of being charged and discharged; and
a semiconductor device controlling the secondary battery,
wherein the semiconductor device includes:
a control unit controlling charge and discharge of the secondary battery; and
a bidirectional connection unit electrically connected to the control unit and through which charge and discharge currents flow,
wherein the semiconductor device includes:
a wiring substrate;
a control chip embedded in the wiring substrate and in which the control unit is formed; and
a semiconductor chip embedded in the wiring substrate and in which the bidirectional connection unit is formed,
wherein the semiconductor chip is formed with:
a semiconductor substrate having a first power transistor and a second power transistor reversely connected in series with the first power transistor formed therein;
a first source electrode formed on a first surface of the semiconductor substrate and electrically connected to a first source of the first power transistor;
a second source electrode formed on the first surface of the semiconductor substrate and electrically connected to a second source of the second power transistor;
a first gate electrode formed on the first surface of the semiconductor substrate and electrically connected to a first gate of the first power transistor;

a second gate electrode formed on the first surface of the semiconductor substrate and electrically connected to a second gate of the second power transistor; and a back surface electrode formed on a second surface on a side opposite to the first surface of the semiconductor substrate and electrically connected to a drain of the first power transistor and a drain of the second power transistor, and wherein an uneven shape is formed on a front surface of the back surface electrode in contact with the wiring substrate.

16. The electronic device according to claim 15, wherein a size of the semiconductor chip is larger than a size of the control chip.

17. The electronic device according to claim 15, wherein the electronic device is a battery pack.

18. The electronic device according to claim 15, wherein a surface roughness of the front surface of the back surface electrode on which the uneven shape is formed is rougher than a surface roughness of a front surface of the first front surface electrode.

19. The electronic device according to claim 18, wherein the first power transistor is a first power MOSFET, wherein the first front surface electrode is electrically connected to a first source of the first power MOSFET, wherein the second front surface electrode is electrically connected to a first gate of the first power MOSFET, wherein the back surface electrode is electrically connected to a first drain of the first power MOSFET, wherein the semiconductor chip includes:
    the semiconductor substrate in which a second power MOSFET reversely connected in series with the first power MOSFET is formed;
    a third front surface electrode formed on the first surface of the semiconductor substrate and electrically connected to a second source of the second power MOSFET;
    a fourth front surface electrode formed on the first surface of the semiconductor substrate and electrically connected to a second gate of the second power MOSFET; and
    the back surface electrode electrically connected to a drain of the second power MOSFET, and wherein a thickness of the back surface electrode is larger than a thickness of each of the first front surface electrode, the second front surface electrode, the third front surface electrode, and the fourth front surface electrode.

20. The electronic device according to claim 19, wherein an external size of the back surface electrode is equal to or less than an external size of the semiconductor substrate.

* * * * *